(12) United States Patent
Jung et al.

(10) Patent No.: US 11,567,532 B2
(45) Date of Patent: Jan. 31, 2023

(54) METHOD FOR PROVIDING SCREEN USING FOLDABLE DISPLAY AND ELECTRONIC DEVICE FOR SUPPORTING SAME

(71) Applicant: SAMSUNG ELECTRONICS CO., LTD., Suwon-si (KR)

(72) Inventors: Junwon Jung, Suwon-si (KR); Younghak Oh, Suwon-si (KR); Kyuok Choi, Suwon-si (KR); Munhwi Kim, Suwon-si (KR); Sangheon Kim, Suwon-si (KR); Seungnyun Kim, Suwon-si (KR); Jongwu Baek, Suwon-si (KR); Woocheol Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 183 days.

(21) Appl. No.: 17/070,055

(22) Filed: Oct. 14, 2020

(65) Prior Publication Data

US 2021/0116965 A1    Apr. 22, 2021

(30) Foreign Application Priority Data

Oct. 16, 2019  (KR) ......................... 10-2019-0128122

(51) Int. Cl.
*G06F 1/16*  (2006.01)
*H05K 5/02*  (2006.01)

(52) U.S. Cl.
CPC .......... *G06F 1/1618* (2013.01); *G06F 1/1647* (2013.01); *G06F 1/1652* (2013.01); *G06F 1/1681* (2013.01); *H05K 5/0226* (2013.01)

(58) Field of Classification Search
None
See application file for complete search history.

(56) References Cited

U.S. PATENT DOCUMENTS

2010/0064244 A1* 3/2010 Kilpatrick, II ...... H04M 1/0243
                                                          345/1.3
2016/0109973 A1* 4/2016 Kim .................... G06F 3/04886
                                                          345/173

(Continued)

FOREIGN PATENT DOCUMENTS

| CN | 208384917  | 1/2019 |
| EP | 3042264    | 5/2018 |
| WO | 2016/056703 | 4/2016 |

OTHER PUBLICATIONS

International Search Report and Written Opinion dated Jan. 15, 2021 in corresponding International Application Mo. PCT/KR2020/012991.

*Primary Examiner* — Anthony Q Edwards
*Assistant Examiner* — Rashen E Morrison
(74) *Attorney, Agent, or Firm* — Nixon & Vanderhye P.C.

(57) ABSTRACT

An electronic device according to various embodiments may include: a housing including a first housing, a second housing, and a third housing; a first hinge configured to enable the first housing and the third housing to pivot, and a second portion configured to enable the second housing and the third housing to pivot; a first display viewable through a first area of the first housing, a second area of the second housing, and a third area of the third housing; at least one sensor; a processor operably connected to the first display and the at least one sensor; and a memory operably connected to the processor, wherein the memory may store instructions that, when executed, cause the processor to control the electronic device to: display a first screen of an application in a first state in which the first area and the second area face the third area, detect, through the at least one sensor, a change from the first state to a second state in which the first area and the third area face a same direction or a third state in which the second area and the third area (Continued)

face a same direction, determine a second screen of the application to be displayed through the first display in a state, among the second state and the third state, changed from the first state, and display the second screen through the first display in the changed state.

18 Claims, 16 Drawing Sheets

(56) References Cited

U.S. PATENT DOCUMENTS

2016/0299539 A1* 10/2016 Jang ..................... G06F 1/1652
2016/0349800 A1   12/2016 Kim et al.

* cited by examiner

METHOD FOR PROVIDING SCREEN USING FOLDABLE DISPLAY AND ELECTRONIC DEVICE FOR SUPPORTING SAME

CROSS-REFERENCE TO RELATED APPLICATION

This application is based on and claims priority under 35 U.S.C. § 119 to Korean Patent Application No. 10-2019-0128122, filed on Oct. 16, 2019, in the Korean Intellectual Property Office, the disclosure of which is incorporated by reference herein in its entirety.

BACKGROUND

Field

Various embodiments relate to a method of providing a screen using a foldable display and an electronic device supporting the same.

Description of Related Art

Recently, electronic devices including a foldable display have been developed. An electronic device including a foldable display may provide improved portability because it is possible to carry the electronic device in a folded state. In addition, an electronic device including a foldable display may provide a screen having a large size.

Further, the electronic device may provide an event-related screen when an event (e.g., a notification event) occurs.

An electronic device including a foldable display according to the prior art displays information on an event that occurs through a first display (or a sub-display) in a folded state thereof, and displays detailed information on the event (or total information related to the event) through a second display (or a main display) when the electronic device is changed from the folded state to an unfolded state.

SUMMARY

Embodiments of the disclosure relate to a method of providing a screen using a foldable display in an electronic device including a multi-foldable display in which a plurality of housings can be folded or unfolded around a plurality of hinge portions, is the electronic device being capable of providing various screens related to an event depending on a folded or unfolded state of at least one of the plurality of housings, and relate to an electronic device supporting the same.

An electronic device according to various example embodiments may include: a housing including a first housing, a second housing, and a third housing; a first hinge configured to enable the first housing and the third housing to pivot, and a second hinge configured to enable the second housing and the third housing to pivot; a first display viewable through a first area of the first housing, a second area of the second housing, and a third area of the third housing; at least one sensor; a processor operably connected to the first display and the at least one sensor; and a memory operably connected to the processor, wherein the memory may store instructions that, when executed, cause the processor to control the electronic device to: display a first screen of an application in a first state in which the first area and the second area face the third area; detect, through the at least one sensor, a change from the first state to a second state in which the first area and the third area face in a same direction or a third state in which the second area and the third area face a same direction; determine a second screen of the application to be displayed through the first display in a state, among the second state and the third state, changed from the first state; and display the second screen through the first display in the changed state.

A method of providing a screen using a foldable display in an electronic device according to various example embodiments may include: displaying a first screen of an application in a first state in which a first area of a first housing of the electronic device and a second area of the electronic device face a third area of the electronic device; detecting, through at least one sensor, a change from the first state to a second state in which the first area and the third area face a same direction or a third state in which the second area and the third area face a same direction; determining a second screen of the application to be displayed through a first display in a state, among the second state and the third state, changed from the first state; and displaying the second screen through the first display in the changed state.

A method of providing a screen using a foldable display according to various embodiments and an electronic device supporting the same can provide various screens related to an event depending on a folded or unfolded state of at least one of a plurality of housings in an electronic device including a multi-foldable display, thereby providing an improved user experience.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
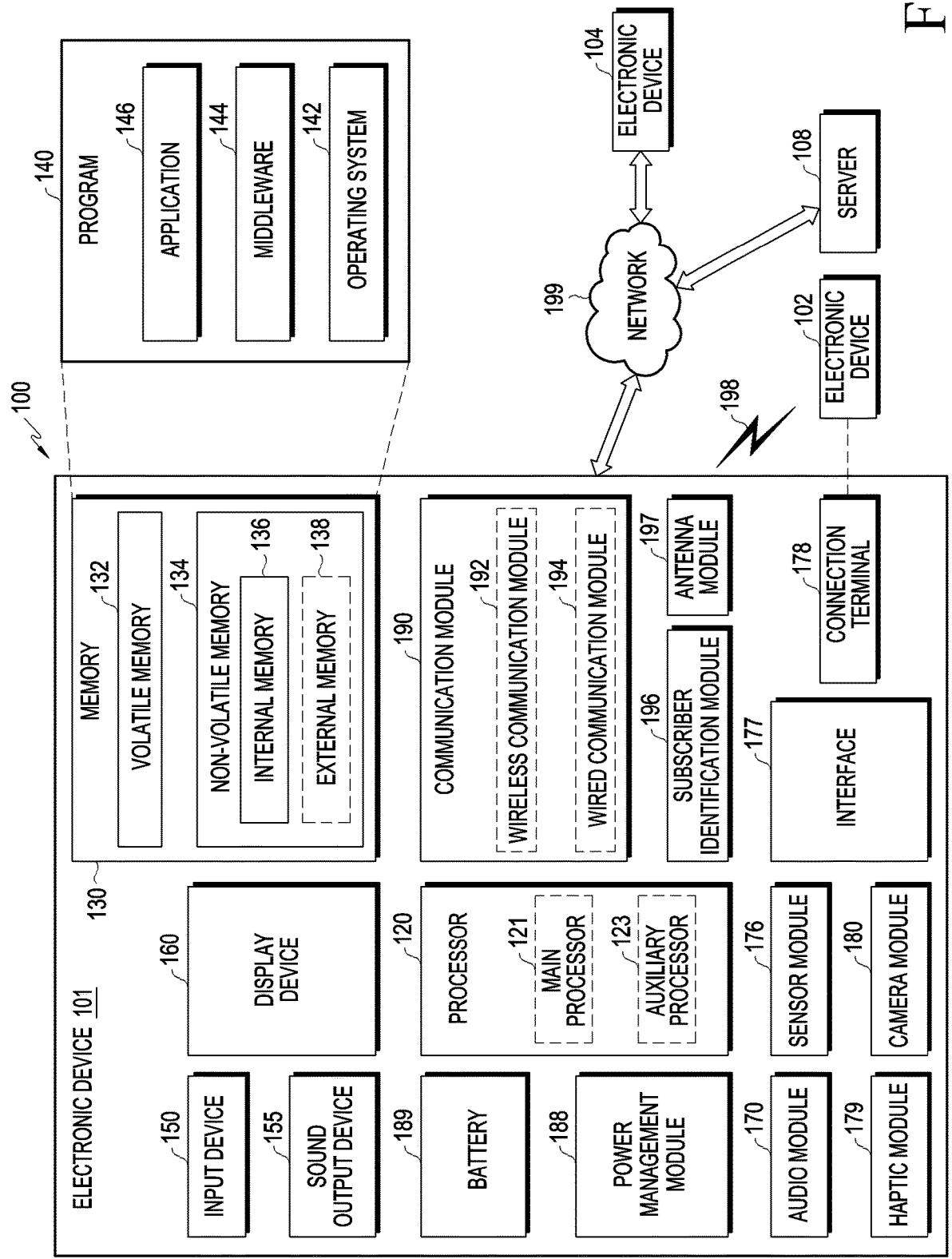
FIG. 1 is a block diagram illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
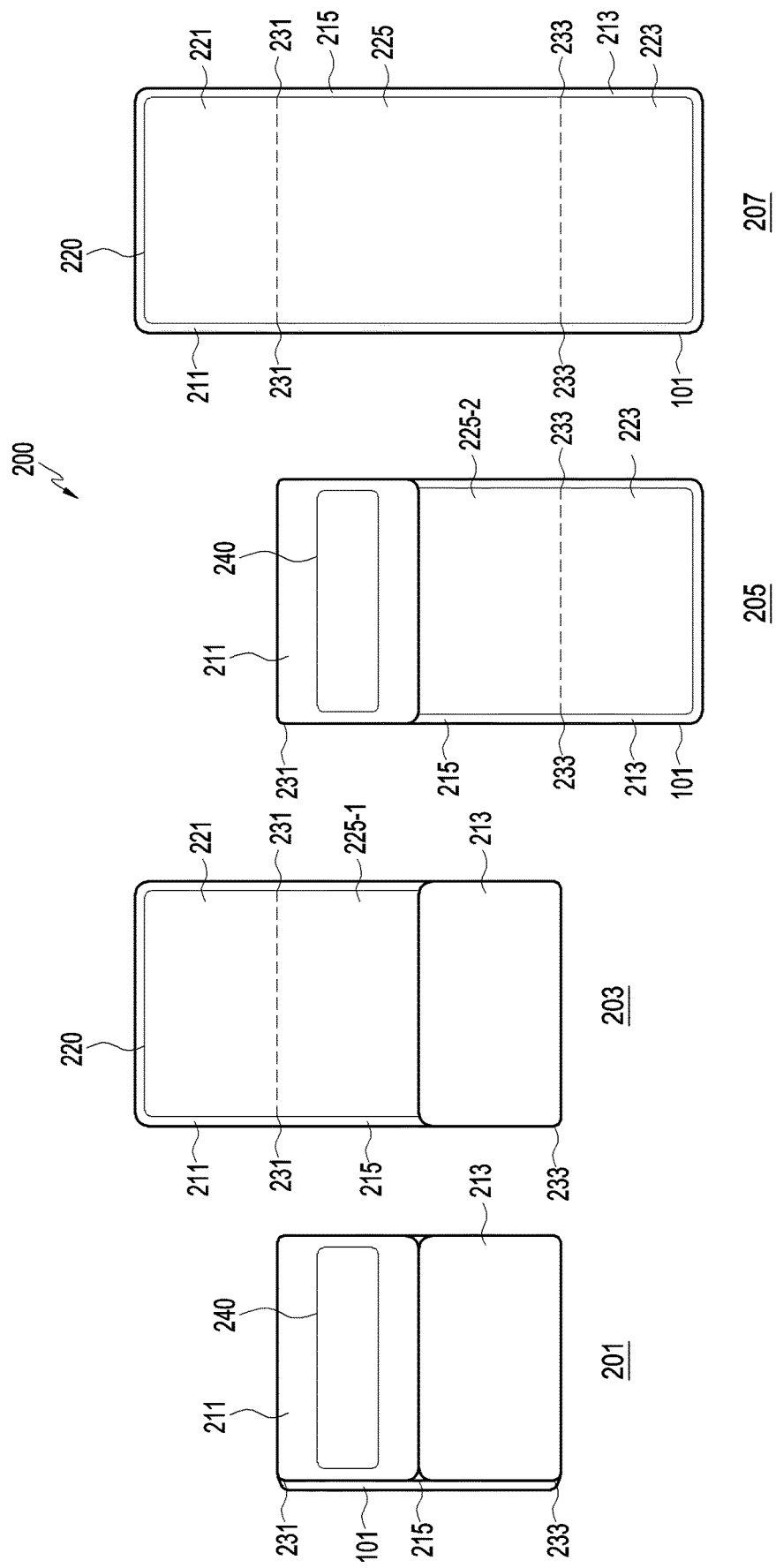
FIG. 2 is a diagram illustrating an example electronic device in various states thereof according to various embodiments.

FIG. 2 is a diagram 200 illustrating an example electronic device in various states according to various embodiments.

Figure 3:
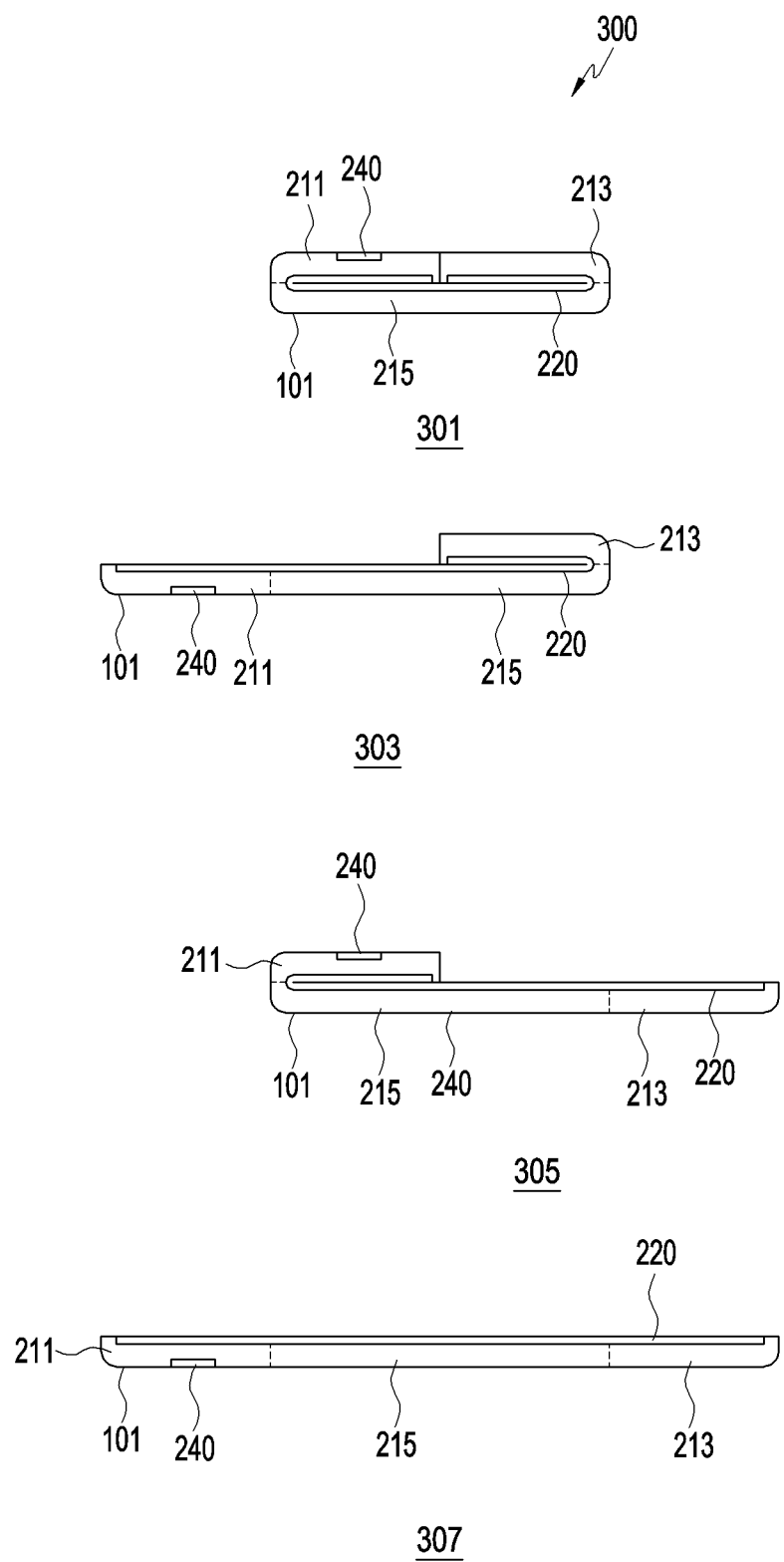
FIG. 3 is a side view of an example electronic device in various states thereof according to various embodiments.

FIG. 3 is a diagram 300 illustrating a side surface of an example electronic device in various states according to various embodiments.

Referring to FIGS. 2 and 3, in an example embodiment, the electronic device 101 may include a first housing 211, a second housing 213, a third housing 215, a first hinge portion (e.g., hinge) 231, and a second hinge portion (e.g., hinge) 233, a first display 220, and a second display 240.

In an embodiment, the first housing 211, the second housing 213, and the third housing 215 may be connected to each other. One side of the first housing 211 may be connected to one side of the third housing 215, and one side of the second housing 213 may be connected to the other side of the third housing 215. In an embodiment, the first housing 211 and the third housing 215 may be connected by the first hinge portion 231 such that the first housing 211 and the third housing 215 pivot (or rotate) around (or based on) the first hinge portion 231. In an embodiment, the second housing 213 and the third housing 215 are connected by the second hinge portion 233 such that the second housing 213 and the third housing 215 pivot around the second hinge portion 233.

In an embodiment, the first display 220 may be viewable to the outside through a first area of the first housing 211, a second area of the second housing 213, and a third area of the third housing 215. For example, the first display 220 may be arranged on the first housing 211, the second housing 213, and the third housing 215 across the first hinge portion 231 and the second hinge portion 233.

In an embodiment, the first display 220 may be a foldable display. In an embodiment, the first display 220 may be folded or unfolded by an operation in which at least one of the first housing 211 or the second housing 213 pivots around at least one of the first hinge portion 231 or the second hinge portion 233 relative to the third housing 215. Although examples in which the first display 220 is folded or unfolded will be described below, the disclosure is not limited thereto. For example, the first display 220 may be implemented to be bendable, and the examples of the foldable first display 220 may be applied to the examples of the bendable first display 220 in the same manner or in a similar manner.

In an embodiment, the second display 240 may be viewable to the outside through a fourth area of the first housing 211. For example, the second display 240 may be disposed in the fourth area of the first housing 211, which faces in a direction opposite the direction in which the first area of the first housing 211 faces. In an embodiment, the second display 240 may be disposed on the rear surface opposite the surface of the first housing 211 in which the first display 220 is disposed. In an embodiment, the second display 240 may be a non-foldable display.

Although not shown in FIGS. 2 and 3, in an embodiment, the electronic device 101 may further include a third display (not shown). In an embodiment, in the case where the electronic device 101 further includes a third display, the third display may be viewable to the outside through a fifth area of the second housing 213. For example, the third display may be disposed on the fifth area of the second housing 213, which faces in the direction opposite the direction in which the second area of the second housing 213 faces. In an embodiment, the third display may be disposed on the rear surface opposite the surface of the second housing 213 in which the first display 220 is disposed. In an embodiment, the third display may be a non-foldable display.

In an embodiment, diagram 201 and diagram 301 may represent the state in which the electronic device 101 is fully folded (hereinafter, referred to as a "first state"). In an embodiment, in the first state, the first area of the first housing 211 and the second area of the second housing 213 may face in the same direction, and the third area of the third housing 215 may face in the direction opposite the direction in which the first area of the first housing 211 and the second area of the second housing 213 face. In the first state, the third area of the third housing 215 may face the first area of the first housing 211 and the second area of the second housing 213. In the first state, the first display 220 may not be viewable to the outside.

In an embodiment, diagram 203 and diagram 303 may represent the state in which the first housing 211 is unfolded and the second housing 213 is folded relative to the third housing 215 (hereinafter, referred to as a "second state"). In an embodiment, in the second state, the first area of the first housing 211 and the third area of the third housing 215 may face in the same direction, and the second area of the second housing 213 may face in the direction opposite the direction in which the third area of the third housing 215 faces. In the second state, a portion of the first display 220 may be viewable to the outside, and the remaining portions of the first display 220 may not be viewable to the outside. For example, in the second state, a portion 221 of the first display 220, which corresponds to the first area of the first housing 211 (or which is disposed in the first area of the first housing 211) and a portion 225-1 of the first display 220, among the third area of the third housing 215, which is closed (or covered) by the first housing 211 in the first state (or a portion of the first display 220 disposed in the area of the third housing 215 corresponding to (or facing) the first area of the first housing 211 in the first state) (hereinafter, referred to as a "first part of the first display 220") may be viewable to the outside. In the second state, the remaining portions of the first display 220, excluding the first part 221 and 225-1 of the first display 220, may not be viewable to the outside.

In an embodiment, diagram 205 and diagram 305 may represent the state in which the first housing 211 is folded and the second housing 213 is unfolded relative to the third housing 215 (hereinafter, referred to as a "third state"). In an embodiment, in the third state, the first area of the first housing 211 face in the direction opposite the direction in which the third area of the third housing 215 faces, and the second area of the second housing 213 and the third area of the third housing 215 may face in the same direction. In the third state, a portion of the first display 220 may be viewable to the outside, and the remaining portions of the first display 220 may not be viewable to the outside. For example, in the third state, a portion 223 of the first display 220, which corresponds to the second area of the second housing 213 (or which is disposed in the second area of the second housing 213) and a portion 225-2 of the first display 220, among the third area of the third housing 215, which is closed by the second housing 213 in the first state (or a portion of the first display 220 disposed in the area of the third housing 215 corresponding to the second area of the second housing 213 in the first state) (hereinafter, referred to as a "second part of the first display 220") may be viewable to the outside. In the third state, the remaining portions of the first display 220 (e.g., the first part of the first display 220), excluding the second part 223 and 225-2 of the first display 220, may not be viewable to the outside.

In an embodiment, diagram 207 and diagram 307 may represent the state in which the electronic device 101 is fully unfolded, for example, the first housing 211 and the second housing 213 are unfolded relative to the third housing 215 (hereinafter, referred to as a "fourth state"). In an embodiment, in the fourth state, the first area of the first housing 211, the second area of the second housing 213, and the third area of the third housing 215 may face in the same direction. In the fourth state, the first display 220 (e.g., the entire front surface of the first display 220) may be viewable to the outside. For example, in the fourth state, both the first part 221 and 225-1 of the first display 220 and the second part 223 and 225-2 of the first display 220 may be viewable to the outside.

Although not shown in FIGS. 2 and 3, in an embodiment, the electronic device 101 may include at least one sensor for detecting the first state, the second state, the third state, and the fourth state. In an embodiment, the at least one sensor may include at least one of a hall sensor, a proximity sensor, an angle sensor, a load cell, an infrared sensor, a pressure sensor, an acceleration sensor, a gyro sensor, or an electromagnetic sensor. However, at least one sensor for detecting the first state, the second state, the third state, and the fourth state of the electronic device 101 is not limited to the above-described examples.

An electronic device according to various example embodiments may include: a housing including a first housing, a second housing, and a third housing; a first hinge configured to enable the first housing and the third housing to pivot, and a second hinge configured to enable the second housing and the third housing to pivot; a first display viewable through a first area of the first housing, a second area of the second housing, and a third area of the third housing; at least one sensor; a processor operably connected to the first display and the at least one sensor; and a memory operably connected to the processor, wherein the memory may store instructions that, when executed, cause the processor to control the electronic device to: display a first screen of an application in a first state in which the first area and the second area face the third area, detect, through the at least one sensor, a change from the first state to a second state in which the first area and the third area face a same direction or a third state in which the second area and the third area face a same direction, determine a second screen of the application to be displayed through the first display in a state, among the second state and the third state, changed from the first state, and display the second screen through the first display in the changed state.

In various example embodiments, the memory may include information for configuring screens for the application corresponding to the second state and the third state, respectively, to be displayed based on the electronic device being changed from the first state to the second state or the third state, and the instructions, when executed, may cause the processor to control the electronic device to: obtain information for configuring a screen corresponding to the changed state from the memory and determine the second screen to be displayed through the first display in the changed state based on the obtained information.

In various example embodiments, the instructions, when executed, may cause the processor to control the electronic device to: determine the second screen to be displayed through the first display in the changed state, based on at least one of an identity of the application or the state of the application in the first state.

In various example embodiments, the instructions, when executed, may cause the processor to control the electronic device to: abased on the electronic device being changed from the first state to the second state, determine a first second screen of the application to be displayed through the first display in the second state and, based on the electronic device being changed from the first state to the third state, determine a second screen of the application to be displayed through the first display in the third state, the second screen being different, at least in part, from the first second screen.

In various example embodiments, the instructions, when executed, may cause the processor to control the electronic device to: determine the first second screen or the second screen to be different based on whether the application is running in a foreground through the first display.

In various example embodiments, the instructions, when executed, may cause the processor to control the electronic device to: display the first screen of the application in the first state through a second display viewable through a fourth area of the first housing, the fourth area facing a direction opposite the direction of the first area.

In various example embodiments, the instructions, when executed, may cause the processor to control the electronic device to: determine to display a screen associated with the second screen through the second display based on the changed state being the third state.

In various example embodiments, the first second screen may include details of information included in the first screen, and the second screen may include a user interface configured to receive an input to control functions of the application.

In various example embodiments, the instructions, when executed, may cause the processor to control the electronic device to: detect, through at least one sensor, a change from the first state to a fourth state in which the first area, the second area, and the third area face a same direction according to an operation in which the second area is unfolded to face a same direction as the third area within a specified time after the first area is unfolded to face a same direction as the third area in the first state, or according to an operation in which the first area is unfolded to face a same direction as the third area within a specified time after the second area is unfolded to face a same direction as the third area in the first state.

In various example embodiments, the application may include a chat message application, an email application, a call application, a music application, a video application, a real-time broadcast application, and/or a weather application.

Figure 4:
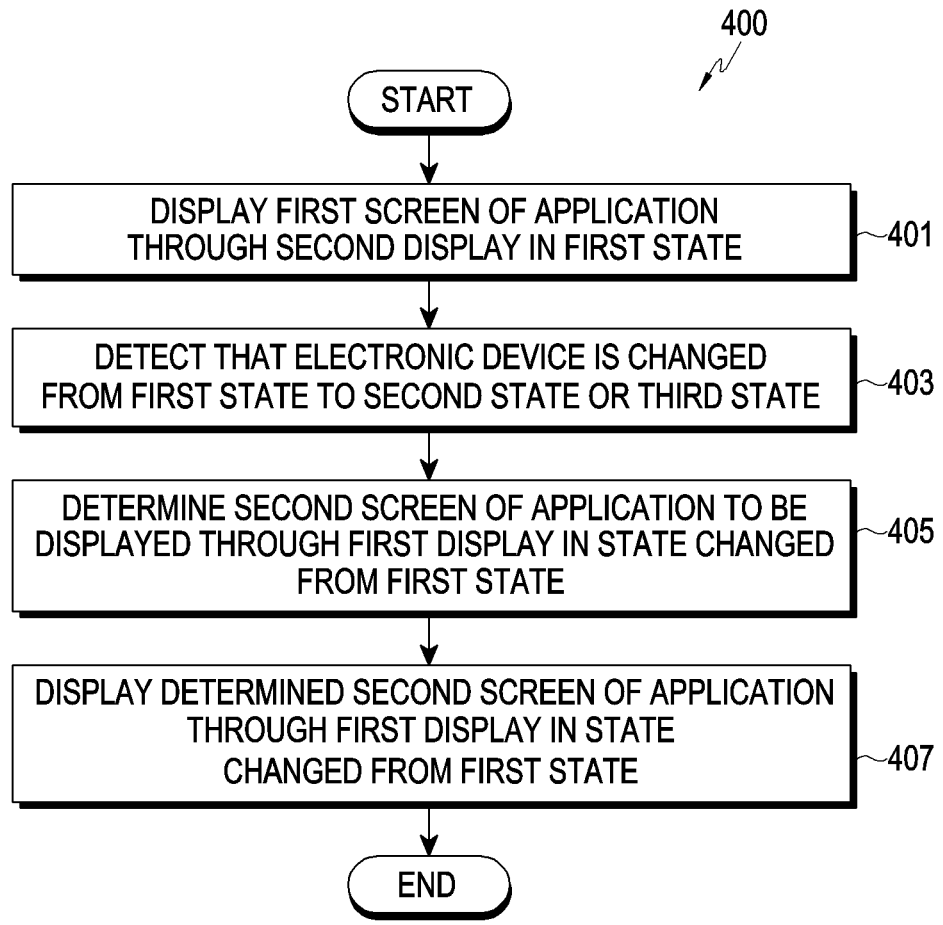
FIG. 4 is a flowchart illustrating an example method of providing a screen using a foldable display of an electronic device according to various embodiments.

FIG. 4 is a flowchart 400 illustrating an example method of providing a screen using a foldable display of an electronic device 101 according to various embodiments.

Referring to FIG. 4, in operation 401, in an embodiment, the processor 120 may control the electronic device to display a first screen of an application through the second display 240 in the first state.

In an embodiment, the first screen of an application may include a screen of a chat message application, an email application, a call application, a music application, a video application, a real-time broadcast application, or a weather application. However, the first screen to be displayed through the second display 240 is not limited to the above examples.

In an embodiment, if an event occurs in the electronic device, the processor 120 may display a first screen of an application related to the event through the second display 240.

In an embodiment, the processor 120 may identify the event occurring in the electronic device 101.

For example, the processor 120 may identify an event that occurs due to reception of a message (e.g., a chat message, an email message, a text message, or a voice message) or a call from an external electronic device (e.g., the electronic devices 102 and 104) through the communication module 190.

As another example, if a specified application is running (or ongoing) in the electronic device 101, the processor 120 may identify an event occurring continuously as the specified application is executed. In an embodiment, the specified application may include an application specified (or configured) to display information on a running application through the second display 240 when the application is executed while the electronic device 101 is in the first state (hereinafter, referred to as a "specified application"). For example, the specified application may include a music application, a video application, and a real-time broadcast application. However, the specified application is not limited to the above-described examples. In an embodiment, the specified application may be specified based on a user input for an application stored in the electronic device 101.

As another example, the processor 120 may identify an event that periodically occurs as information is periodically received from an external electronic device.

In an embodiment, if an event occurs, the processor 120 may display a first screen of an application, which is related to the event, through the second display 240 using the application related to the event.

For example, if an event occurs according to reception of a message from an external electronic device 102, 104 (or if the processor 120 receives an event that occurs), the processor 120 may display, through the second display 240, a first screen including a notification such as information indicating that the message is received, at least a portion of the received message, or a summary of the received message using a message application.

As another example, if an event occurs according to execution of a specified application (e.g., a music application) in the electronic device 101, the processor 120 may display, through the second display 240, a first screen including at least one of information (e.g., a song title) on the content (e.g., music) played by the specified application or an interface (or a controller) for controlling playback of the content.

As another example, if an event occurs according to information (e.g., weather information) periodically received from an external electronic device, the processor 120 may display, through the second display 240, a first screen (e.g., a screen including weather information) including the occurred event and content by an application (e.g., a weather application) in relation to the occurred event.

However, the screen displayed through the second display 240 in the first state when an event occurs is not limited to the above-described examples.

In operation 403, in an embodiment, the processor 120 may detect that the electronic device 101 is changed from the first state to the second state or the third state using at least one sensor.

In an embodiment, the at least one sensor for detecting that the electronic device 101 is changed from the first state to the second state or the third state may include at least one of a hall sensor, a proximity sensor, an angle sensor, a load cell, an infrared sensor, a pressure sensor, an acceleration sensor, a gyro sensor, or an electromagnetic sensor. However, at least one sensor for detecting that the electronic device 101 is changed from the first state to the second state or the third state is not limited to the above-described examples.

In operation 405, in an embodiment, the processor 120 may determine a second screen of the application to be displayed through the first display 220 in the second state or the third state of the electronic device 101, which is changed from the first state (hereinafter, referred to as a "changed state").

In an embodiment, the processor 120 may determine a second screen of the application to be displayed through the first display 220 in the changed state, based on information stored in the memory 130. In an embodiment, the processor 120 may determine a second screen by loading a screen (or layout) stored for each state of the electronic device 101, or may determine a second screen corresponding to the intention for changing the state. Hereinafter, methods for determining the second screen will be described.

In an embodiment, the memory 130 may store information (or layout) for configuring a screen to be displayed to correspond to the changed state of the electronic device 101 for each application (or for respective applications). For example, in relation to a message application, the memory 130 may store information for configuring a screen displaying at least a portion of the entire content of a received message, which corresponds to changing from the first state to the second state and information for configuring a screen for composing a message in response to the received message (e.g., a screen including a text input part and a keyboard), which corresponds to changing from the first state to the third state.

In an embodiment, if the electronic device 101 is changed from the first state to the second state or the third state, the processor 120 may obtain information for configuring a screen corresponding to the second state or the third state and an application changed from the first state (e.g., in the case where an event occurs in the first state, an application corresponding to the occurred event) from the memory 130. The processor 120 may determine a screen, which is to be displayed through the first display 220 in the changed state (e.g., a screen including details of the received message), to be a second screen, based on the information for configuring the screen, which is obtained from the memory 130 (or the information for configuring the screen, which is obtained from the memory 130, and the information related to the event (e.g., content of the received me s sage)).

In an embodiment, the processor 120 may determine a second screen of an application to be displayed through the first display 220 in the changed state, based on the changed state and the information related to the application.

In an embodiment, the processor 120 may determine a second screen of an application to be displayed through the first display 220 in the changed state, based on the changed state and an event that occurs in the first state or information related to the application running in the first state (e.g., at least one of an identity of an application or the type of the application). In an embodiment, the processor 120 may identify a user's intention, based on information on changing of the state (e.g., a changed direction and/or position of a housing (or a display)) and information on a running application. The processor 120 may determine a screen corresponding to a user's intention. The user's intention may be determined based on, for example, a predetermined rule or a learned model based on a user's usage pattern. For example, the electronic device 101 may store a history of a user inputting scrolling commands for messages transmitted and received after changing to the second state while a message application is running. The electronic device 101 may store a history of a user calling a virtual keyboard after changing to the third state while a message application is running. The processor 120 may identify user's intention for each state, based on a model learned based on the stored history. For example, the processor 120 may identify, based on the stored history, that the user's intention corresponding to the changing from the first state to the second state is to display extended information and the user's intention corresponding to the changing from the first state to the third state is to call a virtual keyboard. Meanwhile, a method of identifying the user's intention is not limited to the specified rule-based identification method or the user history-based model, and the user's intention may be identified in any of various ways. In addition, the user's intention is merely a concept for explanation, and the processor 120 may immediately determine a screen corresponding to the application and the changed state without determining the user's intention.

In an embodiment, the processor 120 may identify that the electronic device 101 is changed from the first state to the second state and that the application related to an event that occurs according to reception of a message in the first state is a message application. The processor 120 may determine a screen including details of the message received using the message application to be a second screen to be displayed through the first display 220 in the second state. The processor 120 may identify that the electronic device 101 is changed from the first state to the third state and that the application related to the event that occurs according to reception of a message in the first state is a message application. The processor 120 may determine a screen including a user interface (e.g., a keyboard) for composing a response message to the received message to be a second screen to be displayed on the first display 220 in the third state. In an embodiment, if the application related to the event is a message application, and if the electronic device 101 is changed from the first state to the third state, the processor 120 may display a screen including a user interface (e.g., a keyboard) for composing a response message to the received message through the first display 220 while displaying a portion of the message through the second display 240 viewable to the outside, thereby facilitating the user to write a response message to the message. In addition, if the application related to the event is a message application, and if the electronic device 101 is changed from the first state to the second state, the processor 120 may display a screen including details of the received message through the first display 220, thereby providing the user with a desired screen.

In an embodiment, the processor 120 may identify that the electronic device 101 is changed from the first state to the second state and that the application running in the first state is a music application (or a specified application). The processor 120 may determine to display a screen including information (e.g., a song title) on the content (e.g., music) being played using the music application through the first display 220 in the second state. The processor 120 may identify that the electronic device 101 is changed from the first state to the third state and that the application running in the first state is a music application. The processor 120 may determine to display a screen including a controller for controlling playback of content through the first display 220 in the third state.

In an embodiment, the processor 120 may determine a second screen of an application to be displayed through the first display 220 in the changed state, based on the changed state and the states of applications in the first state.

In an embodiment, the states of applications may be changed stepwise (or continuously) according to continuous inputs, and may denote display steps of displayable screens. For example, in the case where the application is a message application, a first state of the message application may correspond to a step of displaying a screen including a portion of a received message, a second state of the message application may correspond to a step of displaying a screen including the entire content of the received message, and a third state of the message application may correspond to a step of displaying a screen including both the entire content of the received message and a keyboard. The first state, the second state, and the third state of the message application may correspond to steps of displaying screens that are continuously changed according to continuous inputs. However, the disclosure is not limited thereto.

In an embodiment, if it is identified that the state of the application corresponds to the first state of the application in the first state of the electronic device 101, the processor 120 may determine to display a screen corresponding to the second state of the application through the first display 220 when the electronic device 101 is changed from the first state to the second state, and may determine to display a screen corresponding to the third state of the application through the first display 220 when the electronic device 101 is changed from the first state to the third state. In an embodiment, if it is identified that the state of the application corresponds to the second state of the application in the first state of the electronic device 101, the processor 120 may determine to display a screen corresponding to the third state of the application through the first display 220 when the electronic device 101 is changed from the first state to the second state, and may determine to display a screen corresponding to a fourth state of the application (e.g., a step of displaying an application subsequent to the third state of the application) through the first display 220 when the electronic device 101 is changed from the first state to the third state.

Hereinafter, for the convenience of description, in the case where the changed state is the second state, the second screen to be displayed in the second state will be referred to as a "2-$1^{st}$ screen" (e.g., a first second screen), and in the case where the changed state is the third state, the second screen to be displayed in the third state will be referred to as a "2-$2^{nd}$ screen" (e.g., a second screen).

In an embodiment, if the electronic device 101 is changed from the first state to the second state without receiving a user input while displaying the first screen in the first state, the processor 120 may determine to display a 2-$1^{st}$ screen of the application through the first display 220.

In an embodiment, if a user input to the first screen displayed in the first state is received, and if the electronic device 101 is changed from the first state to the second state, the processor 120 may determine to display a 2-$1^{st}$ screen of the application through the first display 220. For example, if the electronic device 101 is changed from the first state to the second state after receiving a user input for a notification displayed through the second display 240 in the first state, the processor 120 may determine to display a 2-$1^{st}$ screen of the application related to the notification through the first display 220.

In an embodiment, if the electronic device 101 is changed from the first state to the second state while the application is running in the foreground, the processor 120 may determine to display a 2-$1^{st}$ screen of the application through the first display 220. In an embodiment, if the electronic device 101 is changed from the first state to the second state while the application is not running in the foreground (for example, while the application is running in the background), the processor 120 may determine to display a screen including information related to an event (e.g., a notification indicating that an event has occurred) through the first display 220 (e.g., an upper area of the first display). In response to a user input to the area where the information related to the event is displayed (e.g., the upper area of the first display), the processor 120 may determine to display the 2-$1^{st}$ screen of the application through the first display 220.

In an embodiment, if the electronic device 101 is changed from the first state to the third state, the processor 120 may determine to display, through the first display 220, a 2-$2^{nd}$ screen of the application related to an event, which includes the same portion (or information) as a portion (or information) of the 2-$1^{st}$ screen to be displayed when the electronic device 101 is changed from the first state to the second state (e.g., a user interface for performing a function of the application or an object mapped to a function of the application). For example, in the case where the event is associated with a specified application (e.g., a video application), the processor 120 may determine to display a 2-$1^{st}$ screen including a video playback screen and a controller for controlling the video through the first display 220 if the electronic device 101 is changed from the first state to the second state, and may determine to display a 2-$2^{nd}$ screen including a video list and a controller for controlling the video through the first display 220 if the electronic device 101 is changed from the first state to the third state.

In an embodiment, if the electronic device 101 is changed from the first state to the third state without receiving a user input while displaying the first screen in the first state, the processor 120 may determine to display a 2-$2^{nd}$ screen of the application through the first display 220.

In an embodiment, if a user input to the first screen displayed in the first state is received, and if the electronic device 101 is changed from the first state to the third state, the processor 120 may determine to display a 2-$2^{nd}$ screen of the application through the first display 220.

In an embodiment, if the electronic device 101 is changed from the first state to the third state while the application is running in the foreground, the processor 120 may determine to display a 2-$2^{nd}$ screen of the application through the first display 220. In an embodiment, if the electronic device 101 is changed from the first state to the third state while the application is not running in the foreground, the processor 120 may determine to display a screen including information related to an event (e.g., a notification indicating that an event has occurred) through the first display 220. In response to a user input to the area where the information related to the event is displayed, the processor 120 may determine to display a 2-$2^{nd}$ screen of the application related to the event through the first display 220.

In an embodiment, if the electronic device 101 is changed from the first state to the third state, the processor 120 may determine to display the first screen through the second display 240 (or may remain the display of the first screen). For example, in the case where the event is associated with reception of a message and the first screen including a portion of the received message is displayed through the second display 240 in the first state, the processor 120 may determine to display, through the second display 240, the first screen including a portion of the received message, which is displayed in the first state, even when the electronic device 101 is changed from the first state to the third state.

In an embodiment, if the electronic device 101 is changed from the first state to the third state, the processor 120 may determine to display a screen which is different, at least in part, from the first screen through the second display 240. For example, in the case where the event is associated with reception of a message and the first screen including a portion of the received message is displayed through the second display 240 in the first state, the processor 120 may determine to display, through the second display 240, a screen including information on the user of a counterpart electronic device 101 transmitting the received message (e.g., an email address of the user of the counterpart electronic device 101), even when the electronic device 101 is changed from the first state to the third state.

In an embodiment, if the electronic device 101 is changed from the first state to the third state, the processor 120 may determine to display associated screens through the second display 240 and the first display 220 (e.g., the second part 223 and 225-2 of the first display 220). For example, if the first screen including a portion of the message is displayed in the first state, and if the electronic device 101 is changed from the first state to the third state, the processor 120 may determine to display the entire message through the second display 240 and the second part 223 and 225-2 of the first display 220. As another example, if the first screen including a portion of the message is displayed in the first state, and if the electronic device 101 is changed from the first state to the third state, the processor 120 may determine to display the entire message through the area of the second display 240 and a portion of the second part of the first display 220 and display a keyboard through another portion of the second part of the first display 220. However, the associated screens displayed through the second display 240 and the first display 220 are not limited to the above-described examples.

In an embodiment, if the electronic device 101 is changed from the first state to the third state, the processor 120 may determine not to display a screen through the second display 240. For example, if the electronic device 101 is changed from the first state to the third state, the processor 120 may determine to turn off the second display 240 and display the 2-$2^{nd}$ screen only through the first display 220.

In operation 407, in an embodiment, the processor 120 may display the determined second screen of the application through the first display 220 in the changed state.

In an embodiment, the processor 120 may display the 2-$2^{nd}$ screen of the application through the first part 221 and 225-1 of the first display 220 when the changed state is the second state.

In an embodiment, the processor 120 may display the 2-$2^{nd}$ screen of the application through the second part 223 and 225-2 of the first display 220 when the changed state is the third state.

In an embodiment, if the changed state is the third state, the processor 120 may display a screen of the application (e.g., the first screen of the application) through the second part 223 and 225-2 of the first display 220 and the second display 240.

Although not shown in FIG. 4, in an embodiment, if the electronic device 101 is changed from the second state or the third state to the first state (for example, if the state of the electronic device 101 returns to the first state from the second state or the third state), the processor 120 may perform control such that the second display 240 does not display the first screen, which is displayed in the first state. For example, in the case where the event is associated with reception of a message in the first state, if the electronic device 101 is changed from the second state or the third state to the first state in the state in which the 2-$1^{st}$ screen or 2-$2^{nd}$ screen is displayed in response to the changing from the first state to the second state or the third state after displaying a notification indicating the reception of the message, the processor 120 may control the second display 240 so as not to display the notification including the reception of the message. However, the disclosure is not limited thereto. For example, in the case where the application related to the event is a specified application (e.g., a music application), if the electronic device 101 is changed from the second state or the third state to the first state while the 2-$1^{st}$ screen or the 2-$2^{nd}$ screen is displayed in the second state or the third state, the processor 120 may control the second display 240 so as to redisplay the first screen related to the specified application, which is displayed in the first state (e.g., a screen including information (e.g., a song title) on the content (music) played through a music application or an interface for controlling the playback of content).

Figure 5:
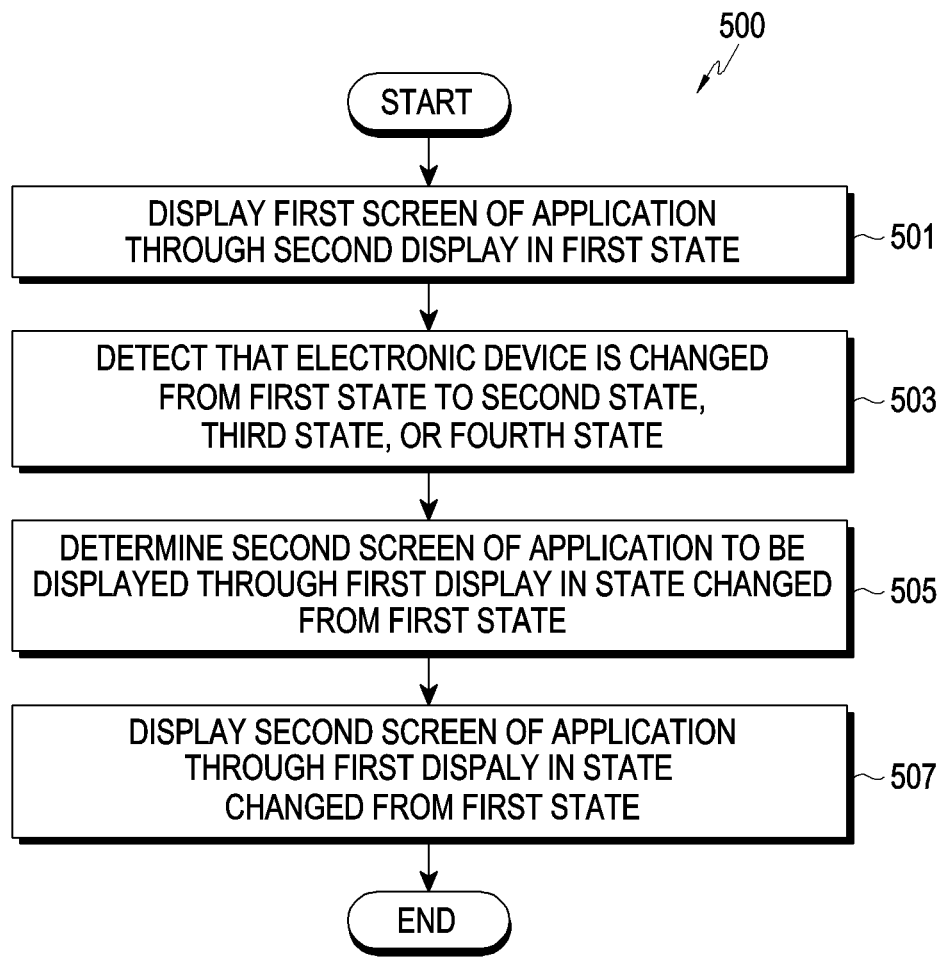
FIG. 5 is a flowchart illustrating an example method of providing a screen using a foldable display of an electronic device according to various embodiments.

FIG. 5 is a flowchart 500 illustrating an example method of providing a screen using a foldable display of an electronic device 101 according to various embodiments. For example, FIG. 5 may further include a method of displaying a screen through the first display 220 if the electronic device 101 is changed from the first state to the fourth state, compared to FIG. 4.

Referring to FIG. 5, in operation 501, in an embodiment, the processor 120 may display a first screen of an application through the second display 240 in the first state.

Since embodiments of operation 501 are, at least in part, the same as or similar to those of operation 401 in FIG. 4, a detailed description thereof may not be repeated here.

In operation 503, in an embodiment, the processor 120 may detect that the electronic device 101 is changed from the first state to the second state, the third state, or the fourth state using at least one sensor.

In an embodiment, the at least one sensor for detecting that the electronic device 101 is changed from the first state to the second state, the third state, or the fourth state may include at least one of a hall sensor, a proximity sensor, an angle sensor, a load cell, an infrared sensor, a pressure sensor, an acceleration sensor, a gyro sensor, or an electromagnetic sensor. However, the at least one sensor for detecting that the electronic device 101 is changed from the first state to the second state, the third state, or the fourth state is not limited to the above-described examples.

In an embodiment, since the operation in which the processor 120 detects that the electronic device 101 is changed from the first state to the second state or the third state through at least one sensor is, at least in part, the same as or similar to the above-described embodiments, a detailed description thereof may not be repeated here.

In an embodiment, the processor 120 may detect that the electronic device 101 is changed from the first state to the fourth state through at least one sensor. For example, the processor 120 may detect that the first housing 211 and the second housing 213 are simultaneously unfolded relative to the third housing 215 in the first state such that the first area of the first housing 211, the second area of the second housing 213, and the third area of the third housing 215 face in the same direction. In an embodiment, the operation in which the first housing 211 and the second housing 213 are simultaneously unfolded relative to the third housing 215 may refer to an operation in which the second area of the second housing 213 is unfolded so as to face in the same direction as the third area of the third housing 215 within a specified time after the first area of the first housing 211 is unfolded so as to face in the same direction as the third area of the third housing 215 in the first state, or an operation in which the first area of the first housing 211 is unfolded so as to face in the same direction as the third area of the third housing 215 within a specified time after the second area of the second housing 213 is unfolded so as to face in the same direction as the third area of the third housing 215 in the first state.

In operation 505, in an embodiment, the processor 120 may determine a second screen of an application to be displayed through the first display 220 in the state of the electronic device 101, among the second state, the third state, and the fourth state, which is changed from the first state.

In an embodiment, in the case where the electronic device 101 is changed from the first state to the second state or the third state, a method in which the processor 120 determines the $2\text{-}1^{st}$ screen or the $2\text{-}2^{nd}$ screen of an application to be displayed through the first display 220 in the changed second state or third state is, at least in part, the same as or similar to the embodiments described in operation 405 in FIG. 4. Thus, a detailed description thereof may not be repeated here. Hereinafter, if the changed state of the electronic device 101 is the fourth state, the second screen to be displayed in the fourth state will be referred to as a "$2\text{-}3^{rd}$ screen".

In an embodiment, the processor 120 may determine a $2\text{-}3^{rd}$ screen of an application to be displayed through the first display 220 in the fourth state, based on information stored in the memory 130.

In an embodiment, the memory 130 may store information (or layout) for configuring a screen to be displayed to correspond to the fourth state of the electronic device 101, as well as the second state and the third state thereof, for each application (or for respective applications).

In an embodiment, if the electronic device 101 is changed from the first state to the fourth state, the processor 120 may obtain, from the memory 130, information (or layout) for configuring a screen corresponding to the fourth state changed from the first state and an application (e.g., in the case where an event occurs in the first state, an application corresponding to the occurred event). The processor 120 may determine the $2\text{-}3^{rd}$ screen to be displayed through the first display 220 in the fourth state, based on the information for configuring the screen, which is obtained from the memory 130 (or the information for configuring the screen, which is obtained from the memory 130, and the information related to the event (e.g., content of the received message)).

In an embodiment, the processor 120 may determine the $2\text{-}3^{rd}$ screen of the application to be displayed through the first display 220 in the fourth state, based on the changed state and information related to the application.

In an embodiment, the processor 120 may determine the $2\text{-}3^{rd}$ screen of the application to be displayed through the first display 220 in the fourth state, based on the fourth state and an application related to an event that occurs in the first state or related to an application running in the first state (e.g., an identity of an application or the type of the application).

In an embodiment, the processor 120 may determine a second screen of the application to be displayed through the first display 220 in the fourth state, based on the fourth state and the state of the application in the first state.

In an embodiment, if the electronic device 101 is changed from the first state to the fourth state, the processor 120 may determine to display the $2\text{-}3^{rd}$ screen of the application, which is different, at least in part, from at least one of the $2\text{-}1^{st}$ screen or the $2\text{-}2^{nd}$ screen, through the first display 220 (e.g., the first part of the first display 220 and the second part of the first display 220).

In an embodiment, if the electronic device 101 is changed from the first state to the fourth state, the processor 120 may determine to display, through the first display 220, a $2\text{-}3^{rd}$ screen of the application, which includes at least a portion of the $2\text{-}1^{st}$ screen displayed in the second state and at least a portion of the $2\text{-}2^{nd}$ screen displayed in the third state.

In an embodiment, if the electronic device 101 is changed from the first state to the fourth state, the processor 120 may determine to display, through the first display 220, a $2\text{-}3^{rd}$ screen in which the positions of at least some of the configurations included the $2\text{-}1^{st}$ screen displayed in the second state and the $2\text{-}2^{nd}$ screen displayed in the third state are changed. For example, the processor 120 may determine to display the configuration (e.g., a controller) of the $2\text{-}1^{st}$ screen, which is displayed in the first part 221 and 225-1 of the first display 220 in the second state, in the second part 223 and 225-2 of the first display 220 in the fourth state.

In an embodiment, if the electronic device 101 is changed from the first state to the fourth state, the processor 120 may determine to display, through the first display 220, a $2\text{-}3^{rd}$ screen including configurations included in the $2\text{-}1^{st}$ screen displayed in the second state and the $2\text{-}2^{nd}$ screen displayed in the third state and additional configurations thereto.

In an embodiment, if it is detected that the electronic device 101 is changed from the first state to the fourth state using at least one sensor without receiving a user input while displaying the first screen in the first state, the processor 120 may determine to display a $2\text{-}3^{rd}$ screen of the application related to an event through the first display 220.

In an embodiment, if a user input to the first screen displayed in the first state is received, and if it is detected that the electronic device 101 is changed from the first state to the fourth state using at least one sensor, the processor 120 may determine to display a $2\text{-}3^{rd}$ screen of the application through the first display 220.

In an embodiment, if it is detected that the electronic device 101 is changed from the first state to the fourth state using at least a sensor while an application is running in the foreground, the processor 120 may determine to display a fourth screen of the application through the first display 220. In an embodiment, if it is detected that the electronic device 101 is changed from the first state to the fourth state using at least a sensor while an application related to an event is not running in the foreground, the processor 120 may determine to display a screen including information related to the event (e.g., a notification indicating that the event has occurred) through the first display 220 (e.g., an upper area of the first display 220). In response to a user input to the area where the information related to the event is displayed (e.g., the upper area of the first display 220), the processor 120 may determine to display the 2-3$^{rd}$ screen of the application related to the event through the first display 220.

Although not shown in FIG. 5, in an embodiment, the processor 120 may determine to turn off the second display 240 in the fourth state. However, the disclosure is not limited thereto, and, in an embodiment, the processor 120 may determine to cause the second display 240 to display the first screen if the electronic device 101 is changed from the first state to the fourth state.

Although not shown in FIG. 5, in an embodiment, in response to the changing from the first state to the fourth state according to an operation in which the first housing 211 and the second housing 213 are simultaneously unfolded relative to the third housing 215, the processor 120 may determine to display, through the first display 220, a 2-3$^{rd}$ screen different from the screen that is displayed in response to the changing from the second state or the third state to the fourth state (e.g., the changing from the second state or the third state to the fourth state a specified time after the changing from the first state to the second state or the third state, or the changing from the first state to the fourth state while displaying the 2-1$^{st}$ screen or the 2-2$^{nd}$ screen). For example, if the first housing 211 and the second housing 213 are simultaneously unfolded relative to the third housing 215 in the first state, the processor 120 may determine to display, through the first display 220, a screen different from the screen displayed when the second housing 213 (or the first housing 211) is unfolded relative to the third housing 215 in the second state (or the third state). However, the disclosure is not limited thereto, and the processor 120, in response to the changing from the first state to the fourth state, may determine to display, through the first display 220, a fourth screen at least a portion of which is the same as the screen displayed in response to the changing from the second state or the third state to the fourth state.

Although not shown in FIG. 5, in an embodiment, if the electronic device is changed from the fourth state to the second state or the third state while displaying the 2-3$^{rd}$ screen in response to the changing from the first state to the fourth state, the processor 120 may determine to display the 2-1$^{st}$ screen to be displayed in the second state or the 2-2$^{nd}$ screen to be displayed in the third state through the first display 220 (or the first display 220 and the second display 240). However, the disclosure is not limited thereto.

In operation 507, in an embodiment, the processor 120 may display the second screen of the application determined in operation 505 through the first display 220 in the changed state.

In an embodiment, the processor 120 may display the 2-2$^{nd}$ screen of the application through the first part 221 and 225-1 of the first display 220 if the changed state is the second state.

In an embodiment, the processor 120 may display the 2-2$^{nd}$ screen of the application through the second part 223 and 225-2 of the first display 220 if the changed state is the third state.

In an embodiment, if the changed state is the third state, the processor 120 may display a screen of the application (e.g., the first screen of the application) through the second part 223 and 225-2 of the first display 220 and the second display 240.

In an embodiment, the processor 120 may display the 2-3$^{rd}$ screen of the application through the entire first display 220 if the changed state is the fourth state.

Although not shown in FIG. 5, in an embodiment, if the electronic device is changed from the fourth state to the first state while displaying the 2-3$^{rd}$ screen in response to the changing from the first state to the fourth state, the processor 120 may display the first screen, or may not display a screen through the second display 240. For example, if the electronic device is changed from the fourth state to the first state while displaying the fourth screen related to a specified application in response to the changing from the first state to the fourth state, the processor 120 may redisplay, through the second display 240, the first screen including at least one of information (e.g., a song title) on the content (e.g., music) played through a specified application or an interface for controlling playback of the content. As another example, if the electronic device is changed from the fourth state to the first state while displaying the 2-3$^{rd}$ screen related to a message application in response to the changing from the first state to the fourth state, the processor 120 may not redisplay, through the second display 240, the notification related to the message displayed in the first state.

Figure 6:
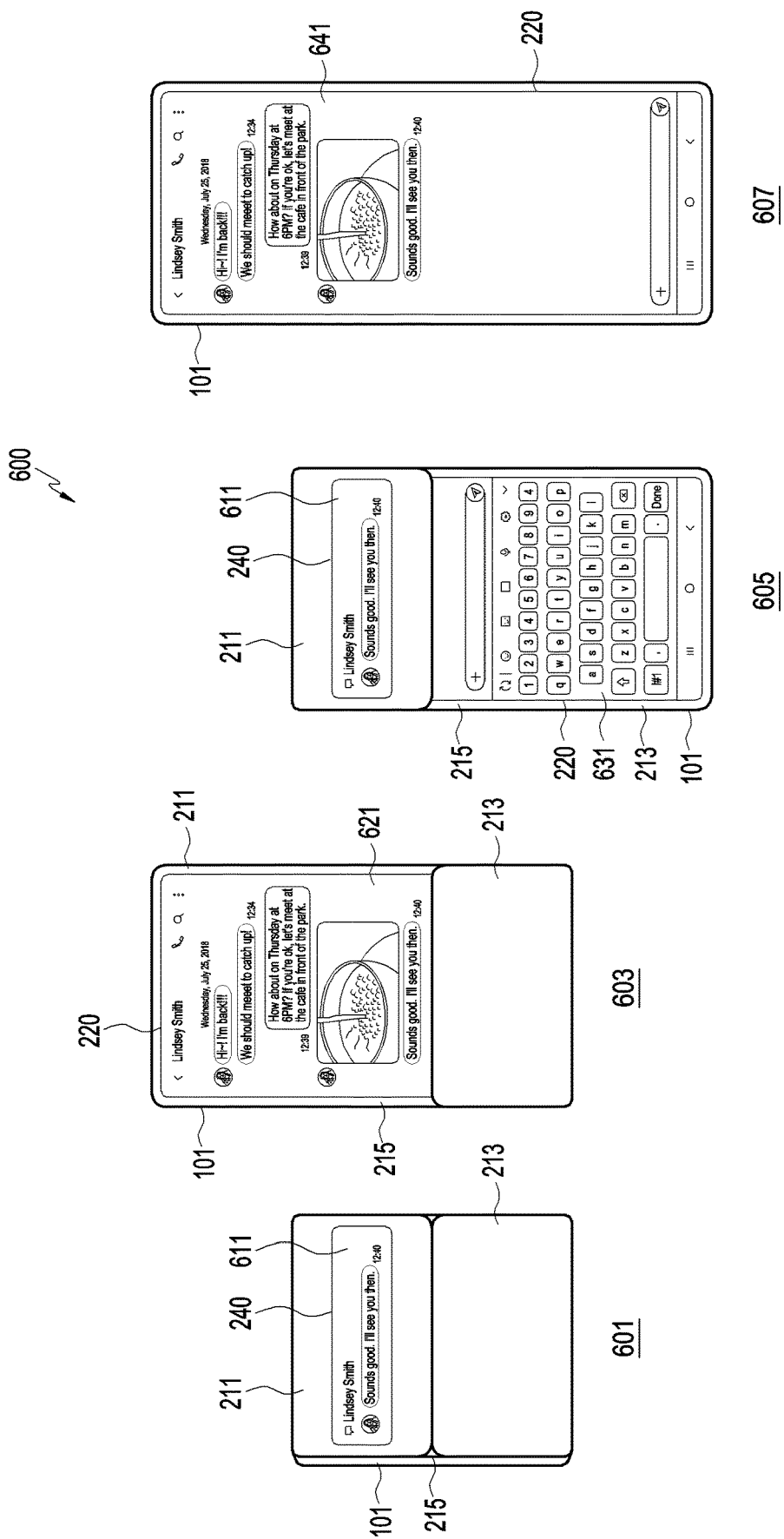
FIG. 6 is a diagram illustrating an example method of providing a screen related to a chat message application using a foldable display of an electronic device according to various embodiments.

FIG. 6 is a diagram 600 illustrating an example method of providing a screen related to a chat message application using a foldable display of an electronic device 101 according to various embodiments.

Referring to FIG. 6, in an embodiment, the processor 120 may identify an event occurring in the electronic device 101 in the first state in diagram 601. For example, the processor 120 may identify an event that occurs upon receiving a chat message from an external electronic device 102, 104 in the first state. In 30 an embodiment, the processor 120 may display, through the second display 240, a first screen 611 of a chat message application related to the occurred event in the first state. For example, as shown in diagram 601, the processor 120 may display, through the second display 240, a first screen 611 including a portion of the received chat message (e.g., a most recently received chat message), the name of the other party who sent the received chat message, an image of the other party who sent the received chat message, and information on the time at which the chat message is received using the chat message application. However, the first screen 611 displayed through the second display 240 is not limited to the above-described example.

In diagram 603, in an embodiment, the processor 120 may detect that the electronic device 101 is changed from the first state to the second state using at least one sensor. In an embodiment, in response to detecting that the electronic device 101 is changed from the first state to the second state, the processor 120 may display, through the first display 220 (e.g., the first part of the first display 220), a 2-1$^{st}$ screen 621 corresponding to the changing from the first state to the second state using the chat message application. For example, in response to detecting that the electronic device 101 is changed from the first state to the second state, the processor 120 may display, through the first display 220, a 2-1$^{st}$ screen 621 including the most recently received chat message included in the first screen 611, the image received together with the most recently received chat message, and a list of chat messages transmitted and received prior to the most recently received chat message using the chat message application.

In diagram 605, in an embodiment, the processor 120 may detect that the electronic device 101 is changed from the first state to the third state through at least one sensor. In an embodiment, in response to detecting that the electronic device 101 is changed from the first state to the third state, the processor 120 may display, through the first display 220 (e.g., the second part 223 and 225-2 of the first display 220), a 2-2$^{nd}$ screen 631 corresponding to the changing from the first state to the third state, which is different, at least in part, from the 2-1$^{st}$ screen 621 displayed in the second state, using the chat message application. For example, in response to detecting that the electronic device 101 is changed from the first state to the third state, the processor 120 may display, through the first display 220, a 2-2$^{nd}$ screen 631 including an input part and a keyboard for inputting a conversation to be transmitted to the other party (or a counterpart electronic device 101) using the chat message application.

In diagram 605, in an embodiment, if the electronic device 101 is changed from the first state to the third state, the processor 120 may display the first screen 611, which is displayed in the first state (or may maintain the display of the first screen that is displayed in the first state), through the second display 240. However, the disclosure is not limited thereto. For example, in an embodiment, if the electronic device 101 is changed from the first state to the third state, the processor 120 may display, through the second display 240, a screen which is different, at least in part, from the first screen 611 that is displayed in the first state. For example, if the electronic device 101 is changed from the first state to the third state, the processor 120 may further display, through the second display 240, some of the chat messages transmitted and received prior to the most recently received chat message, in addition to the information included in the first screen 611 displayed in the first state. As another example, if the electronic device 101 is changed from the first state to the third state, the processor 120 may further display, through the second display 240, a scroll bar for scrolling some of the chat messages transmitted and received prior to the most recently received chat message, in addition to the information included in the first screen 611 displayed in the first state. However, the screen displayed through the second display 240 in the third state is not limited to the above-described example.

In an embodiment, if it is detected that the electronic device 101 is changed from the first state to the third state, the processor 120 may display associated screens through the second display 240 and the first display 220 (e.g., the second part 223 and 225-2 of the first display 220). For example, if the processor 120 detects that the electronic device 101 is changed from the first state to the third state, the processor 120 may display the other party (or a counterpart electronic device) through the second display 240, may display the most recently received chat message displayed in the first state through a portion of the second part 223 and 225-2 of the first display 220, and may display an input part and a keyboard for inputting a conversation to be transmitted to the other party (or the counterpart electronic device 101) through another portion of the second part 223 and 225-2 of the first display 220.

In diagram 607, in an embodiment, the processor 120 may detect that the electronic device 101 is changed from the first state to the fourth state through at least one sensor. For example, the processor 120 may detect that the first housing 211 and the second housing 213 are simultaneously unfolded relative to the third housing 215 in the first state such that the first area of the first housing 211, the second area of the second housing 213, and the third area of the third housing 215 face in the same direction.

In an embodiment, in response to detecting that the electronic device 101 is changed from the first state to the fourth state, the processor 120 may display a 2-3$^{rd}$ screen 641 of the chat message application corresponding to the changing from the first state to the fourth state, which is different, at least in part, from at least one of the 2-1$^{st}$ screen 621 or the 2-2$^{nd}$ screen 631, through the first display 220 (e.g., the first part 221 and 225-1 of the first display 220 and the second part 223 and 225-2 of the first display 220) using the chat message application. For example, in response to detecting that the electronic device 101 is changed from the first state to the fourth state, the processor 120 may display, through the first display 220, the 2-3$^{rd}$ screen 641 including information included in the 2-1$^{st}$ screen 621 and an input part for inputting a conversation to be transmitted to the other party (or the counterpart electronic device) included in the 2-2$^{nd}$ screen 631 using the chat message application.

Figure 7:
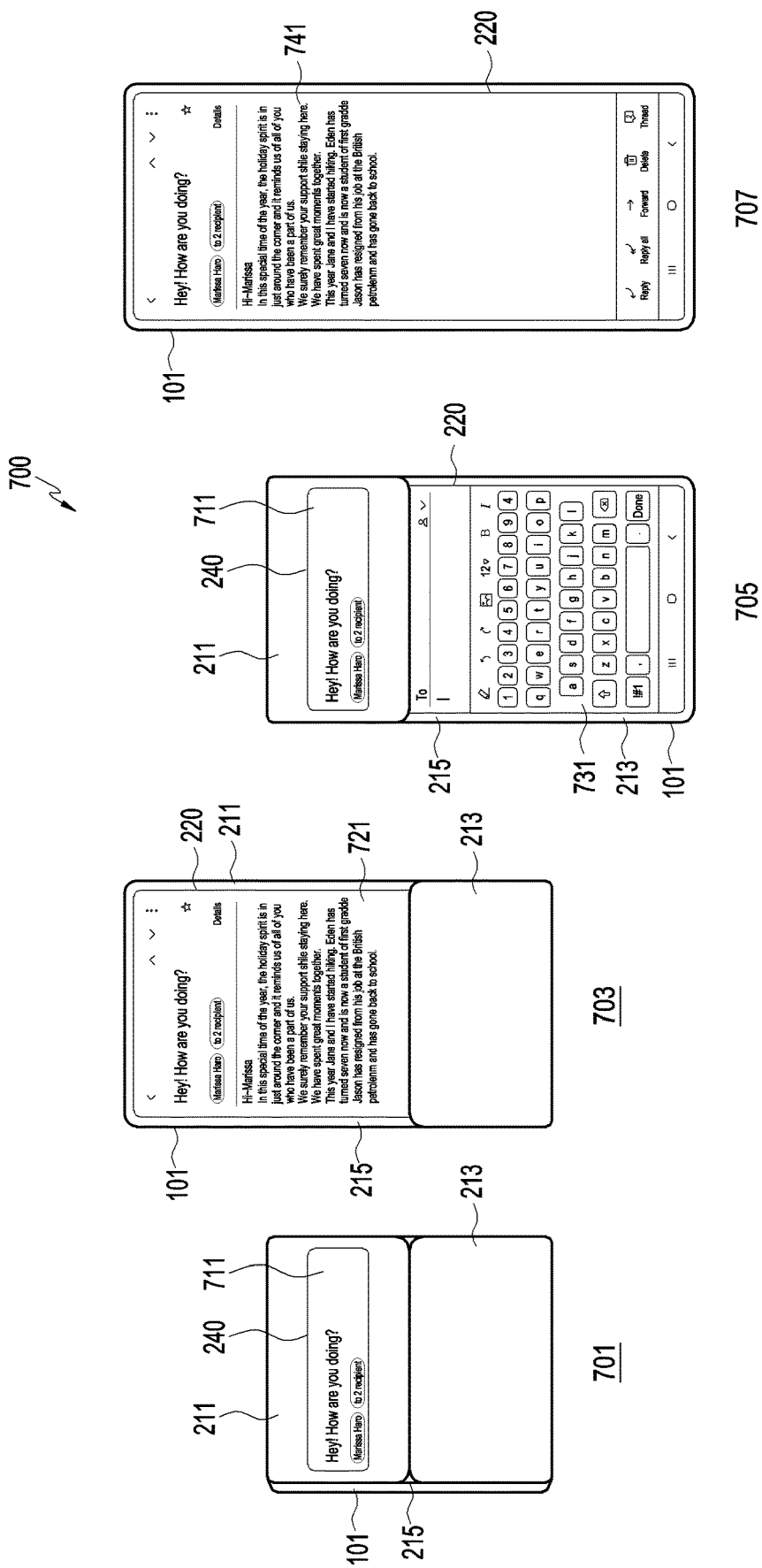
FIG. 7 is a diagram illustrating an example method of providing a screen related to an email message application using a foldable display of an electronic device according to various embodiments.

FIG. 7 is a diagram 700 illustrating an example method of providing a screen related to an email message application using a foldable display of an electronic device 101 according to various embodiments.

Referring to FIG. 7, in an embodiment, the processor 120 may identify an event occurring in the electronic device 101 in the first state in diagram 701. For example, the processor 120 may identify an event that occurs upon receiving an email message from an external electronic device 102, 104 in the first state. In an embodiment, the processor 120 may display, through the second display 240, a first screen 711 of the email message application related to the occurred event in the first state. For example, as shown in diagram 701, the processor 120 may display, through the second display 240, a first screen 711 including the subject of the received email message (e.g., the most recently received email message) and information on the recipient of the email message (e.g., the user of the electronic device 101) using the email message application. However, the first screen 711 displayed through the second display 240 is not limited to the above-described example.

In diagram 703, in an embodiment, the processor 120 may detect that the electronic device 101 is changed from the first state to the second state through at least one sensor. In an embodiment, in response to detecting that the electronic device 101 is changed from the first state to the second state, the processor 120 may display, through the first display 220 (e.g., the first part 221 and 225-1 of the first display 220), a 2-1$^{st}$ screen 721 corresponding to the changing from the first state to the second state using the email message application. For example, in response to detecting that the electronic device 101 is changed from the first state to the second state, the processor 120 may display, through the first display 220, a 2-1$^{st}$ screen 721 including the subject of the most recently received email message, content thereof, and information on the recipient of the email message (e.g., the user of the electronic device 101) using the email message application.

In diagram 705, in an embodiment, the processor 120 may detect that the electronic device 101 is changed from the first state to the third state through at least one sensor. In an embodiment, in response to detecting that the electronic device 101 is changed from the first state to the third state, the processor 120 may display, through the first display 220 (e.g., the second part 223 and 225-2 of the first display 220), a 2-2$^{nd}$ screen 731 corresponding to the changing from the first state to the third state, which is different, at least in part, from the 2-1$^{st}$ screen 721 displayed in the second state, using the email message application. For example, in response to detecting that the electronic device 101 is changed from the first state to the third state, the processor 120 may display, through the first display 220, a 2-2$^{nd}$ screen 731 including an input part and a keyboard for inputting an email to be transmitted to the other party (or the counterpart electronic device 101) using the email message application.

In diagram 705, in an embodiment, if the electronic device 101 is changed from the first state to the third state, the processor 120 may display the first screen 711, which is displayed in the first state (or may maintain the display of the first screen 711 that is displayed in the first state), through the second display 240. However, the disclosure is not limited thereto. For example, in an embodiment, if the electronic device 101 is changed from the first state to the third state, the processor 120 may display, through the second display 240, a screen that is different, at least in part, from the first screen 711 displayed in the first state.

In an embodiment, if it is detected that the electronic device 101 is changed from the first state to the third state, the processor 120 may display associated screens through the second display 240 and the first display 220 (e.g., the second part 223 and 225-2 of the first display 220).

In diagram 707, in an embodiment, the processor 120 may detect that the electronic device 101 is changed from the first state to the fourth state through at least one sensor.

In an embodiment, in response to detecting that the electronic device 101 is changed from the first state to the fourth state, the processor 120 may display a 2-3$^{rd}$ screen 741 of the email message application corresponding to the changing from the first state to the fourth state, which is different, at least in part, from at least one of the 2-1$^{st}$ screen 721 or the 2-2$^{nd}$ screen 731, through the first display 220 (e.g., the first part 221 and 225-1 of the first display 220 and the second part 223 and 225-2 of the first display 220) using the email message application. For example, in response to detecting that the electronic device 101 is changed from the first state to the fourth state, the processor 120 may display, through the first display 220, a 2-3$^{rd}$ screen 741 including information included in the 2-1$^{st}$ screen 721 and a menu related to functions of the email message application using the email message application.

Figure 8:
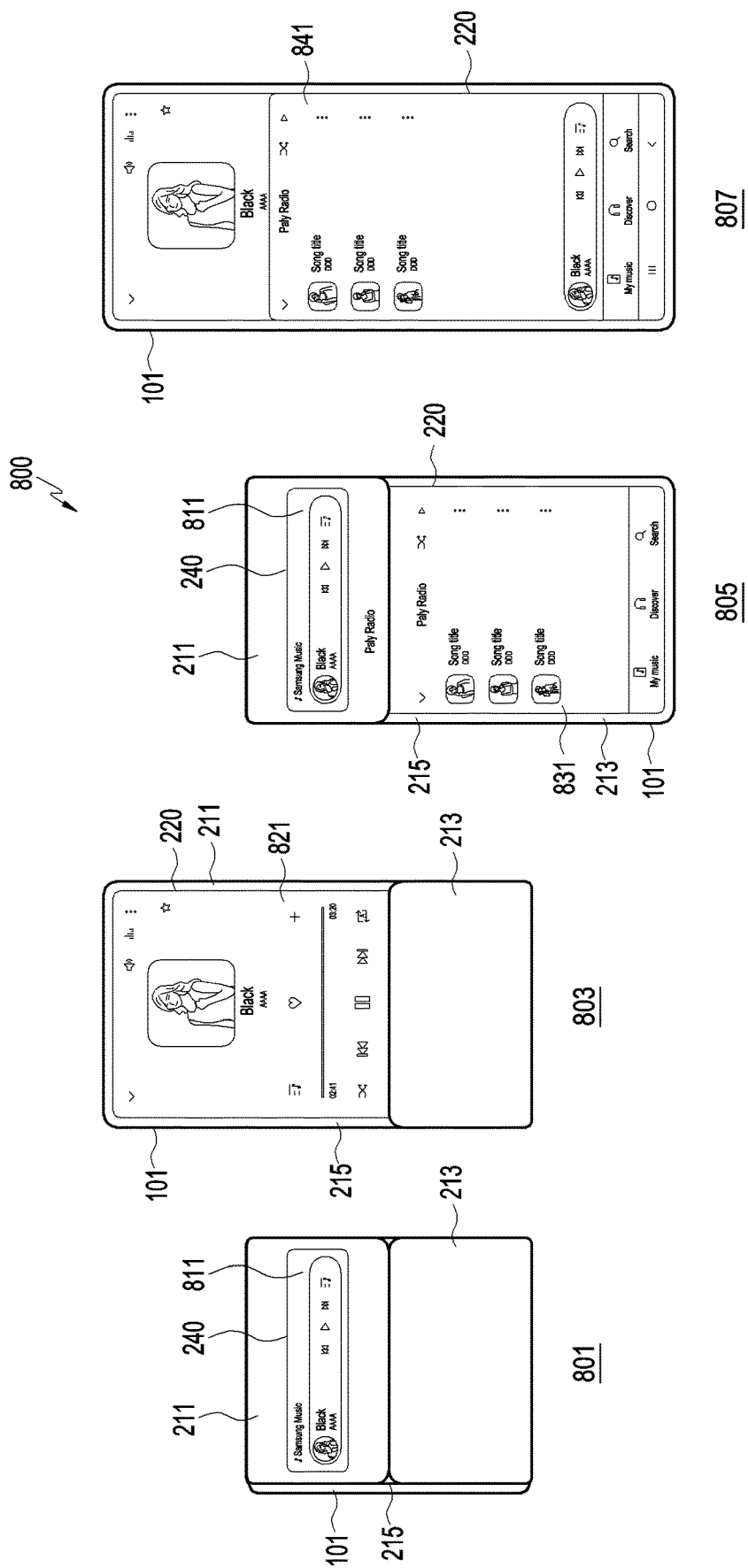
FIG. 8 is a diagram illustrating an example method of providing a screen related to a music application using a foldable display of an electronic device according to various embodiments.

FIG. 8 is a diagram 800 illustrating an example method of providing a screen related to a music application using a foldable display of an electronic device 101 according to various embodiments.

Referring to FIG. 8, in an embodiment, the processor 120 may identify an event occurring in the electronic device 101 in the first state in diagram 801. For example, the processor 120 may identify an event that occurs when executing a music application as an application specified in the electronic device 101 in the first state. In an embodiment, the processor 120 may display, through the second display 240, a first screen 811 of the music application related to the occurred event in the first state. For example, as shown in diagram 801, the processor 120 may display, through the second display 240, a first screen 811 including information (e.g., a song title, a singer's name, etc.) on the content (e.g., music) being played and an interface for controlling playback of the content. However, the first screen 811 displayed through the second display 240 is not limited to the above-described example.

In diagram 803, in an embodiment, the processor 120 may detect that the electronic device 101 is changed from the first state to the second state through at least one sensor. In an embodiment, in response to detecting that the electronic device 101 is changed from the first state to the second state, the processor 120 may display, through the first display 220 (e.g., the first part 221 and 225-1 of the first display 220), a 2-1$^{st}$ screen 821 corresponding to the changing from the first state to the second state using the music application. For example, in response to detecting that the electronic device 101 is changed from the first state to the second state, the processor 120 may display, through the first display 220, a 2-1$^{st}$ screen 821 including information (e.g., a song title, a singer's name, etc.) on the content (e.g., music) being played, a progress bar indicating the degree of playback (or progress) of the content (or a played part), and an interface for controlling playback of the content using the music application.

In diagram 805, in an embodiment, the processor 120 may detect that the electronic device 101 is changed from the first state to the third state through at least one sensor. In an embodiment, in response to detecting that the electronic device 101 is changed from the first state to the third state, the processor 120 may display, through the first display 220 (e.g., the second part 223 and 225-2 of the first display 220), a 2-2$^{nd}$ screen 831 corresponding to the changing from the first state to the third state, which is different, at least in part, from the 2-1$^{st}$ screen 821 displayed in the second state, using the music application. For example, in response to detecting that the electronic device 101 is changed from the first state to the third state, the processor 120 may display, through the first display 220, a 2-2$^{nd}$ screen 831 including a list of playable songs and a menu related to functions of the music application using the music application.

In diagram 805, in an embodiment, if the electronic device 101 is changed from the first state to the third state, the processor 120 may display the first screen 811, which is displayed in the first state, through the second display 240. However, the disclosure is not limited thereto. For example, in an embodiment, if the electronic device 101 is changed from the first state to the third state, the processor 120 may display, through the second display 240, a screen that is different, at least in part, from the first screen 811 displayed in the first state.

In an embodiment, if it is detected that the electronic device 101 is changed from the first state to the third state, the processor 120 may display associated screens through the second display 240 and the first display 220 (e.g., the second part 223 and 225-2 of the first display 220).

In diagram 807, in an embodiment, the processor 120 may detect that the electronic device 101 is changed from the first state to the fourth state through at least one sensor.

In an embodiment, in response to detecting that the electronic device 101 is changed from the first state to the fourth state, the processor 120 may display a 2-3$^{rd}$ screen 841 of the music application corresponding to the changing from the first state to the fourth state, which is different, at least in part, from at least one of the 2-1$^{st}$ screen 821 or the 2-2$^{nd}$ screen 831, through the first display 220 (e.g., the first part 221 and 225-1 of the first display 220 and the second part 223 and 225-2 of the first display 220) using the music application. For example, in response to detecting that the electronic device 101 is changed from the first state to the fourth state, the processor 120 may display, through the first display 220, a 2-3$^{rd}$ screen 841 including an album image of music, a singer's name, a list of playable songs, an interface for controlling playback of content, and a menu related to functions of the music application using the music application.

Figure 9:
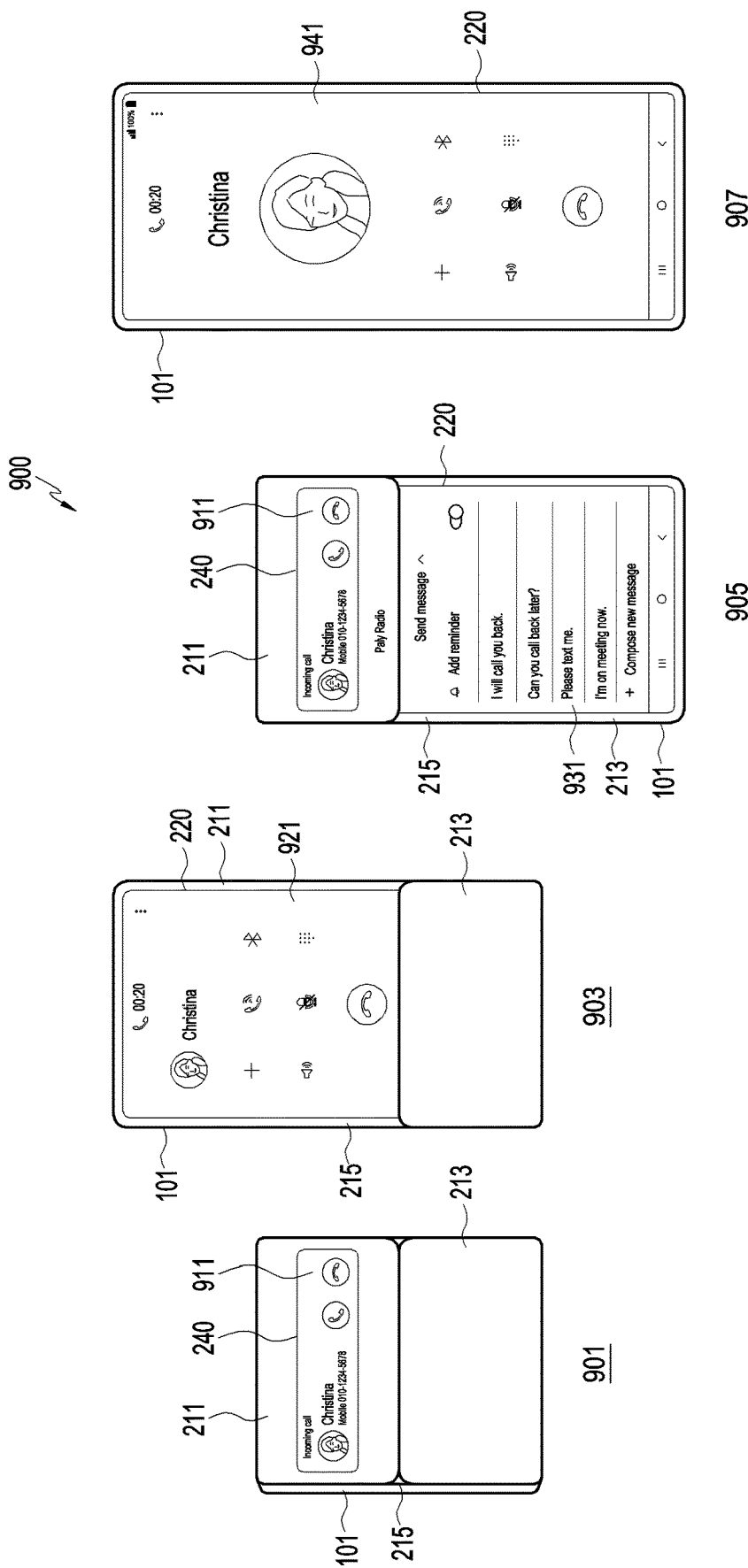
FIG. 9 is a diagram illustrating an example method of providing a screen related to a call application using a foldable display of an electronic device according to various embodiments.

FIG. 9 is a diagram 900 illustrating an example method of providing a screen related to a call application using a foldable display of an electronic device 101 according to various embodiments.

Referring to FIG. 9, in an embodiment, the processor 120 may identify an event occurring in the electronic device 101 in the first state in diagram 901. For example, the processor 120 may identify an event that occurs upon receiving a call from an external electronic device 102, 104 in the first state. In an embodiment, the processor 120 may display, through the second display 240, a first screen 911 of a call application related to the occurred event in the first state. For example, as shown in diagram 901, the processor 120 may display, through the second display 240, a first screen 911 including text indicating that a call is received, an image of the other party making the call, the name and phone number of the other party making the call, an object for answering the call, and an object for rejecting the call. However, the first screen 911 displayed through the second display 240 is not limited to the above-described example.

In diagram 903, in an embodiment, the processor 120 may detect that the electronic device 101 is changed from the first state to the second state through at least one sensor. In an embodiment, in response to detecting that the electronic device 101 is changed from the first state to the second state, the processor 120 may display, through the first display 220 (e.g., the first part 221 and 225-1 of the first display 220), a 2-$1^{st}$ screen 921 corresponding to the changing from the first state to the second state using the call application. For example, in response to detecting that the electronic device 101 is changed from the first state to the second state, the processor 120 may answer the call (for example, may receive an incoming call) using the call application, and may display, through the first display 220, a 2-$1^{st}$ screen 921 including an image of the other party making the call, the name of the other party making the call, and a menu related to functions of the call application.

In diagram 905, in an embodiment, the processor 120 may detect that the electronic device 101 is changed from the first state to the third state through at least one sensor. In an embodiment, in response to detecting that the electronic device 101 is changed from the first state to the third state, the processor 120 may display, through the first display 220 (e.g., the second part 223 and 225-2 of the first display 220), a 2-$2^{nd}$ screen 931 corresponding to the changing from the first state to the third state, which is different, at least in part, from the 2-$1^{st}$ screen 921 displayed in the second state, using the call application. For example, in response to detecting that the electronic device 101 is changed from the first state to the third state, the processor 120 may display, through the first display 220, a 2-$2^{nd}$ screen 931 for rejecting the call and including a list of voice messages to be transmitted to the other party using the call application.

In diagram 905, in an embodiment, if the electronic device 101 is changed from the first state to the third state, the processor 120 may display the first screen 911, which is displayed in the first state, through the second display 240. However, the disclosure is not limited thereto. For example, in an embodiment, if the electronic device 101 is changed from the first state to the third state, the processor 120 may display, through the second display 240, a screen that is different, at least in part, from the first screen 911 displayed in the first state.

In an embodiment, if it is detected that the electronic device 101 is changed from the first state to the third state, the processor 120 may display associated screens through the second display 240 and the first display 220 (e.g., the second part 223 and 225-2 of the first display 220).

In diagram 907, in an embodiment, the processor 120 may detect that the electronic device 101 is changed from the first state to the fourth state through at least one sensor.

In an embodiment, in response to detecting that the electronic device 101 is changed from the first state to the fourth state, the processor 120 may display a 2-$3^{rd}$ screen 941 of the call application corresponding to the changing from the first state to the fourth state, which is different, at least in part, from at least one of the 2-$1^{st}$ screen 921 or the 2-$2^{nd}$ screen 931, through the first display 220 using the call application. For example, in response to detecting that the electronic device 101 is changed from the first state to the fourth state, the processor 120 may perform a call using the call application, and may display a 2-$3^{rd}$ screen 941 in which the position of at least one of the image of the other party making the call, the name of the other party making the call, and the menu related to functions of the call application included in the 2-$1^{st}$ screen is changed through the first display 220.

Figure 10:
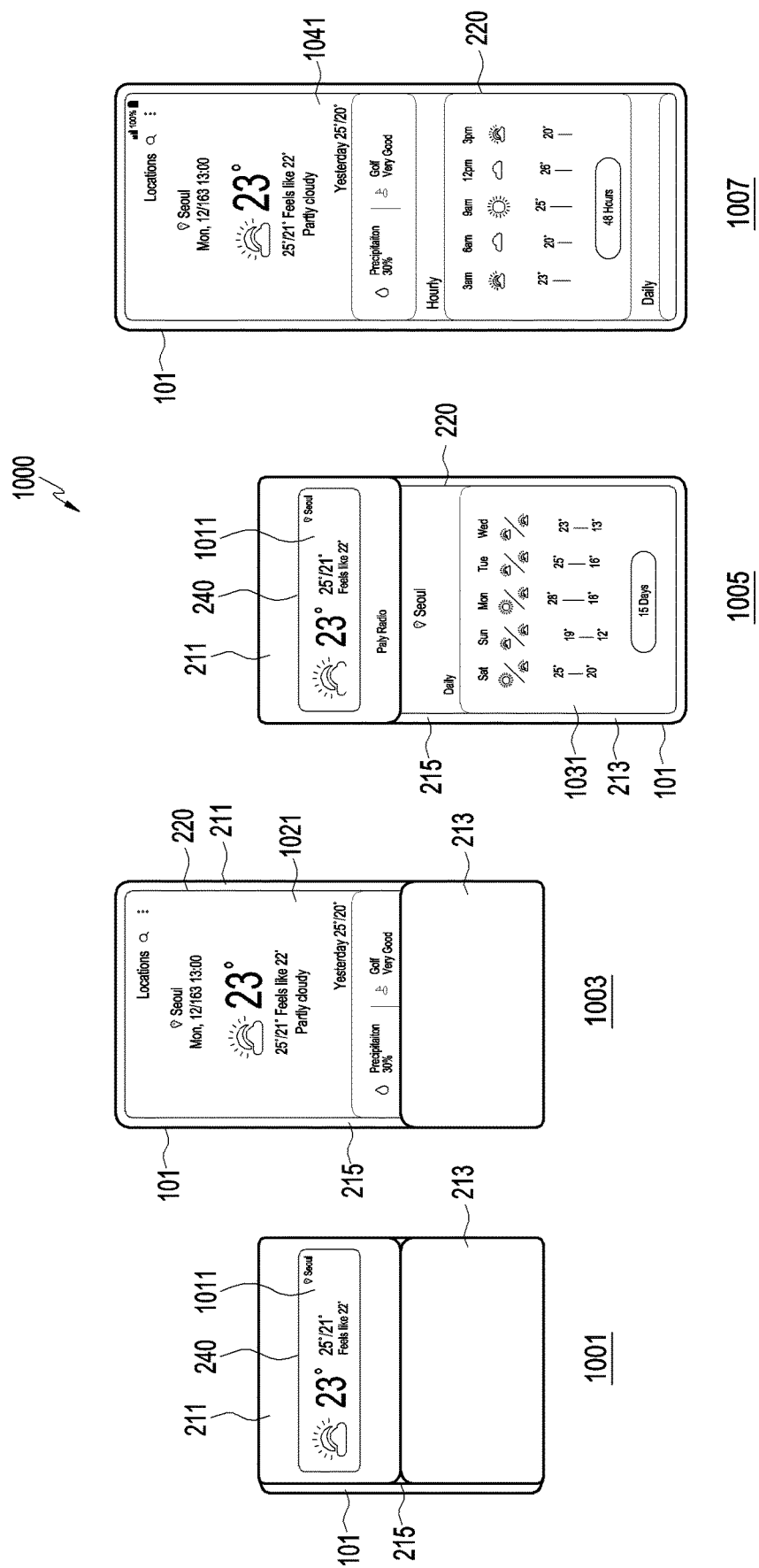
FIG. 10 is a diagram illustrating an example method of providing a screen related to a weather application using a foldable display of an electronic device according to various embodiments.

FIG. 10 is a diagram 1000 illustrating an example method of providing a screen related to a weather application using a foldable display of an electronic device 101 according to various embodiments.

Referring to FIG. 10, in an embodiment, the processor 120 may identify an event occurring in the electronic device 101 in the first state in diagram 1001. For example, the processor 120 may identify an event that occurs continuously (or periodically) in relation to a weather application of weather information configured to be displayed as default through the second display 240 in the first state. In an embodiment, the processor 120 may display, through the second display 240, a first screen 1011 of the weather application related to the occurred event in the first state. For example, as shown in diagram 1001, the processor 120 may display, through the second display 240, a first screen 1011 including information on the summary of today's weather in a specified region (e.g., New York). However, the first screen 1011 displayed through the second display 240 is not limited to the above-described example.

In diagram 1003, in an embodiment, the processor 120 may detect that the electronic device 101 is changed from the first state to the second state through at least one sensor. In an embodiment, in response to detecting that the electronic device 101 is changed from the first state to the second state, the processor 120 may display, through the first display 220 (e.g., the first part 221 and 225-1 of the first display 220), a 2-$1^{st}$ screen 1021 corresponding to the changing from the first state to the second state using the weather application. For example, in response to detecting that the electronic device 101 is changed from the first state to the second state, the processor 120 may display, through the first display 220, a 2-$1^{st}$ screen 1021 including detailed information on today's weather using the weather application.

In diagram 1005, in an embodiment, the processor 120 may detect that the electronic device 101 is changed from the first state to the third state through at least one sensor. In an embodiment, in response to detecting that the electronic device 101 is changed from the first state to the third state, the processor 120 may display, through the first display 220 (e.g., the second part 223 and 225-2 of the first display 220), a 2-$2^{nd}$ screen 1031 corresponding to the changing from the first state to the third state, which is different, at least in part, from the 2-$1^{st}$ screen 1021 displayed in the second state, using the weather application. For example, in response to detecting that the electronic device 101 is changed from the first state to the third state, the processor 120 may display, through the first display 220, a $2\text{-}2^{nd}$ screen 1031 including information on the weather of a week in a specified region using the weather application.

In diagram 1005, in an embodiment, if the electronic device 101 is changed from the first state to the third state, the processor 120 may display the first screen 1011, which is displayed in the first state, through the second display 240. However, the disclosure is not limited thereto. For example, in an embodiment, if the electronic device 101 is changed from the first state to the third state, the processor 120 may display, through the second display 240, a screen that is different, at least in part, from the first screen 1011 displayed in the first state.

In an embodiment, if it is detected that the electronic device 101 is changed from the first state to the third state, the processor 120 may display associated screens through the second display 240 and the first display 220 (e.g., the second part 223 and 225-2 of the first display 220).

In diagram 1007, in an embodiment, the processor 120 may detect that the electronic device 101 is changed from the first state to the fourth state through at least one sensor.

In an embodiment, in response to detecting that the electronic device 101 is changed from the first state to the fourth state, the processor 120 may display a $2\text{-}3^{rd}$ screen 1041 of the weather application corresponding to the changing from the first state to the fourth state, which is different, at least in part, from at least one of the $2\text{-}1^{st}$ screen 1021 or the $2\text{-}2^{nd}$ screen 1031, through the first display 220 using the weather application. For example, in response to detecting that the electronic device 101 is changed from the first state to the fourth state, the processor 120 may display, through the first display 220, a $2\text{-}3^{rd}$ screen 1041 including detailed information on today's weather containing hourly-based weather information for today using the weather application.

Figure 11:
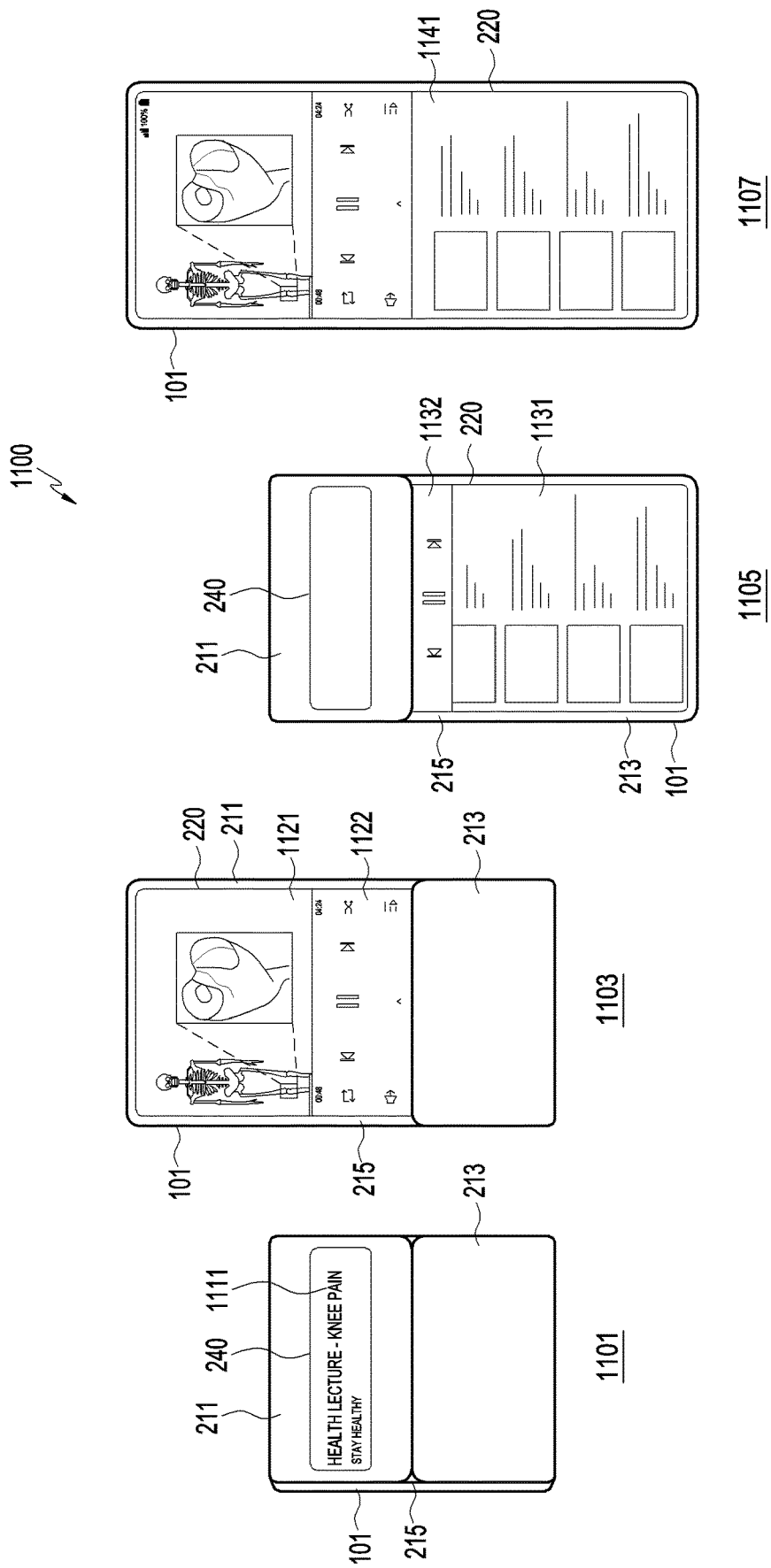
FIG. 11 is a diagram illustrating an example method of providing a screen related to a video application using a foldable display of an electronic device according to various embodiments.

FIG. 11 is a diagram 1100 illustrating an example of a method of providing a screen related to a video application using a foldable display of an electronic device 101 according to various embodiments.

Referring to FIG. 11, in an embodiment, the processor 120 may identify an event occurring in the electronic device 101 in the first state in diagram 1101. For example, the processor 120 may identify an event that occurs due to execution of content by a video application as a specified application in the electronic device 101 in the first state. In an embodiment, the processor 120 may display, through the second display 240, a first screen 1111 of the video application related to the occurred event in the first state. For example, as shown in diagram 1101, the processor 120 may display, through the second display 240, a first screen 1111 including the title of a video being played. However, the first screen 1111 displayed through the second display 240 is not limited to the above-described example. In an embodiment, the played video may include a video stored in the electronic device 101 or a video received from an external electronic device 102, 104 in a streaming method.

In diagram 1103, in an embodiment, the processor 120 may detect that the electronic device 101 is changed from the first state to the second state through at least one sensor. In an embodiment, in response to detecting that the electronic device 101 is changed from the first state to the second state, the processor 120 may display, through the first display 220, a $2\text{-}1^{st}$ screen 1121 corresponding to the changing from the first state to the second state using the video application. For example, in response to detecting that the electronic device 101 is changed from the first state to the second state, the processor 120 may display, through the first display 220, a $2\text{-}1^{st}$ screen 1121 including the video content being played and an interface 1122 for controlling playback of the video content being played using the video application.

In diagram 1105, in an embodiment, the processor 120 may detect that the electronic device 101 is changed from the first state to the third state through at least one sensor. In an embodiment, in response to detecting that the electronic device 101 is changed from the first state to the third state, the processor 120 may display, through the first display 220, a $2\text{-}2^{nd}$ screen 1131 corresponding to the changing from the first state to the third state, which is different, at least in part, from the $2\text{-}1^{st}$ screen 1121 displayed in the second state, using the video application. For example, in response to detecting that the electronic device 101 is changed from the first state to the third state, the processor 120 may display, through the first display 220, a $2\text{-}2^{nd}$ screen 1131 including an interface 1132 for controlling the playback of the video content being played and a list of playable videos using the video application. As shown in diagram 1103 and diagram 1105, in an embodiment, for usability, the $2\text{-}1^{st}$ screen 1121 displayed in the second state and the $2\text{-}2^{nd}$ screen 1131 displayed in the third state may include, in common, an interface for controlling the playback of the video content being played (e.g., the interface 1122 for controlling the playback of the video content being played or the interface 1132 for controlling the playback of the video content being played). As shown in diagram 1103 and diagram 1105, in an embodiment, the interface for controlling the playback of the video content being played, which is a common configuration included in the $2\text{-}1^{st}$ screen 1121 displayed in the second state and the $2\text{-}2^{nd}$ screen 1131 displayed in the third state, may be configured in different forms between the second state and the third state. For example, the interface 1122 for controlling the playback of the video content being played may further include an object corresponding to additional functions (e.g., a speaker volume control function, a list display function, and the like), compared to the interface 1132 for controlling the playback of the video content being played. However, the disclosure is not limited thereto, and the configurations commonly included in the $2\text{-}1^{st}$ screen 1121 displayed in the second state and the $2\text{-}2^{nd}$ screen 1113 displayed in the third state may be configured in the same form in the second state and the third state.

In diagram 1105, in an embodiment, if the electronic device 101 is changed from the first state to the third state, the processor 120 may not display the first screen 1111, which is displayed in the first state, through the second display 240. However, the disclosure is not limited thereto.

In diagram 1107, in an embodiment, the processor 120 may detect that the electronic device 101 is changed from the first state to the fourth state through at least one sensor. In an embodiment, in response to detecting that the electronic device 101 is changed from the first state to the fourth state, the processor 120 may display a $2\text{-}3^{rd}$ screen of the video application corresponding to the changing from the first state to the fourth state, which is different, at least in part, from at least one of the $2\text{-}1^{st}$ screen 1121 or the $2\text{-}2^{nd}$ screen 1131, through the first display 220 using the video application. For example, in response to detecting that the electronic device 101 is changed from the first state to the fourth state, the processor 120 may display, through the first display 220, a $2\text{-}3^{rd}$ screen 1141 including the video content being played, the interface 1122 for controlling playback of the video content being played and the list of playable videos.

Figure 12:
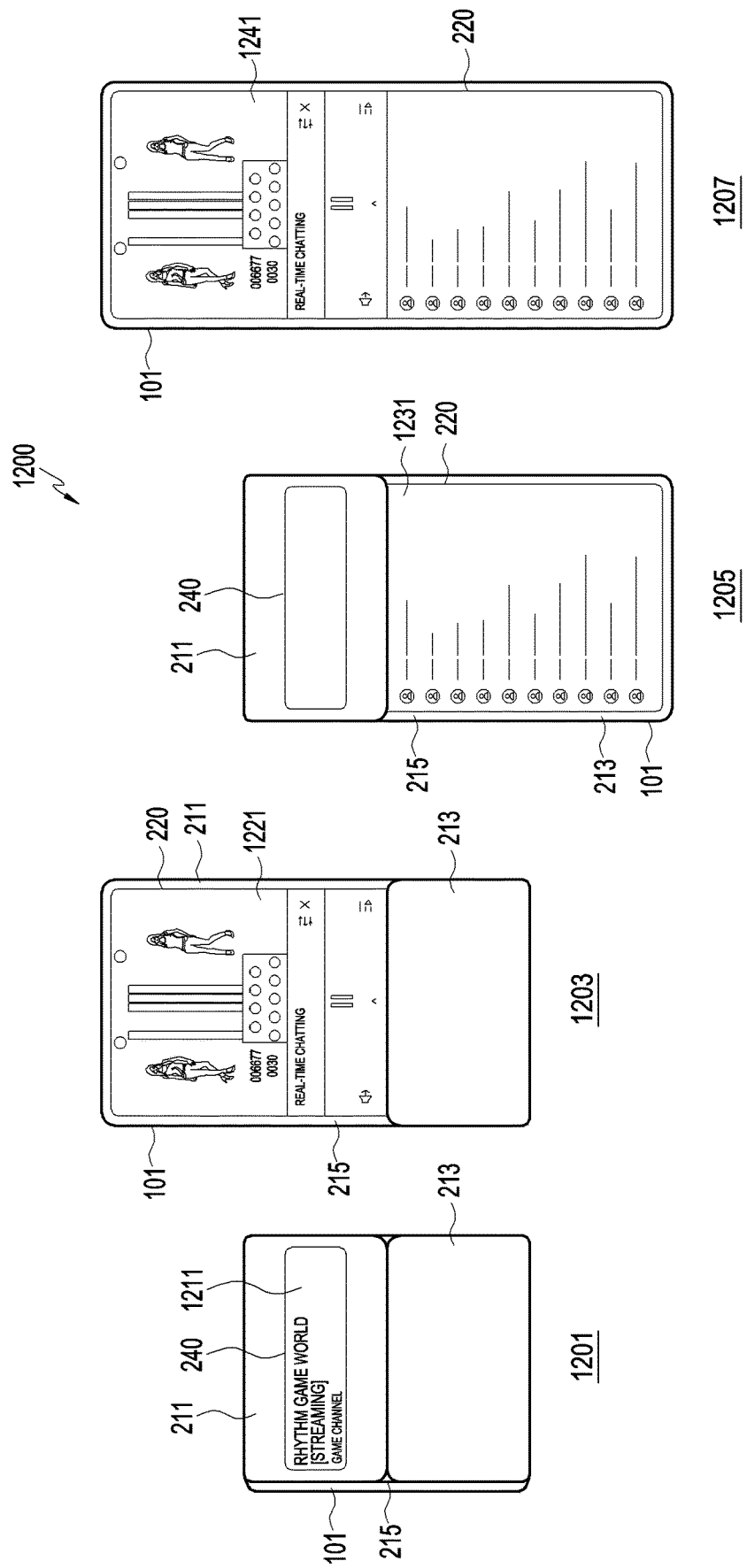
FIG. 12 is a diagram illustrating an example method of providing a screen related to a real-time broadcast application using a foldable display of an electronic device according to various embodiments.

FIG. 12 is a diagram 1200 illustrating an example method of providing a screen related to a real-time broadcast application using a foldable display of an electronic device 101 according to various embodiments.

Referring to FIG. 12, in an embodiment, the processor 120 may identify an event occurring in the electronic device 101 in the first state in diagram 1201. For example, the processor 120 may identify an event that occurs due to execution of content by a real-time broadcast application as a specified application in the electronic device 101 in the first state. In an embodiment, the processor 120 may display, through the second display 240, a first screen 1211 of the real-time broadcast application related to the occurred event in the first state. For example, as shown in diagram 1201, the processor 120 may display, through the second display 240, a first screen 1211 including the title of a real-time broadcast being performed (e.g., the title of a broadcast for a game). However, the first screen 1211 displayed through the second display 240 is not limited to the above-described example.

In diagram 1203, in an embodiment, the processor 120 may detect that the electronic device 101 is changed from the first state to the second state through at least one sensor. In an embodiment, in response to detecting that the electronic device 101 is changed from the first state to the second state, the processor 120 may display, through the first display 220, a 2-$1^{st}$ screen 1221 corresponding to the changing from the first state to the second state using the real-time broadcast application. For example, in response to detecting that the electronic device 101 is changed from the first state to the second state, the processor 120 may display, through the first display 220, a 2-$1^{st}$ screen 1221 including the real-time broadcast content and an interface for controlling the playback of the real-time broadcast content using the real-time broadcast application.

In diagram 1205, in an embodiment, the processor 120 may detect that the electronic device 101 is changed from the first state to the third state through at least one sensor. In an embodiment, in response to detecting that the electronic device 101 is changed from the first state to the third state, the processor 120 may display, through the first display 220, a 2-$2^{nd}$ screen 1231 corresponding to the changing from the first state to the third state, which is different, at least in part, from the 2-$1^{st}$ screen 1221 displayed in the second state, using the real-time broadcast application. For example, in response to detecting that the electronic device 101 is changed from the first state to the third state, the processor 120 may display, through the first display 220, a 2-$2^{nd}$ screen 1231 including a list of participants to the real-time broadcast and comments (or replies) written by the participants using the real-time broadcast application.

In an embodiment, in diagram 1205, in an embodiment, if the electronic device 101 is changed from the first state to the third state, the processor 120 may not display the first screen 1211 displayed in the first state through the second display 240. However, the disclosure is not limited thereto.

In diagram 1207, in an embodiment, the processor 120 may detect that the electronic device 101 is changed from the first state to the fourth state through at least one sensor. In an embodiment, in response to detecting that the electronic device 101 is changed from the first state to the fourth state, the processor 120 may display a 2-$3^{rd}$ screen 1241 of the real-time broadcast application corresponding to the changing from the first state to the fourth state, which is different, at least in part, from at least one of the 2-$1^{st}$ screen 1221 or the 2-$2^{nd}$ screen 1231, through the first display 220 using the real-time broadcast application. For example, in response to detecting that the electronic device 101 is changed from the first state to the fourth state, the processor 120 may display, through the first display 220, a 2-$3^{rd}$ screen 1241 including real-time broadcast content, an interface for controlling playback of the real-time broadcast content, a list of participants to the real-time broadcast, and comments (or replies) written by the participants.

Figure 13:
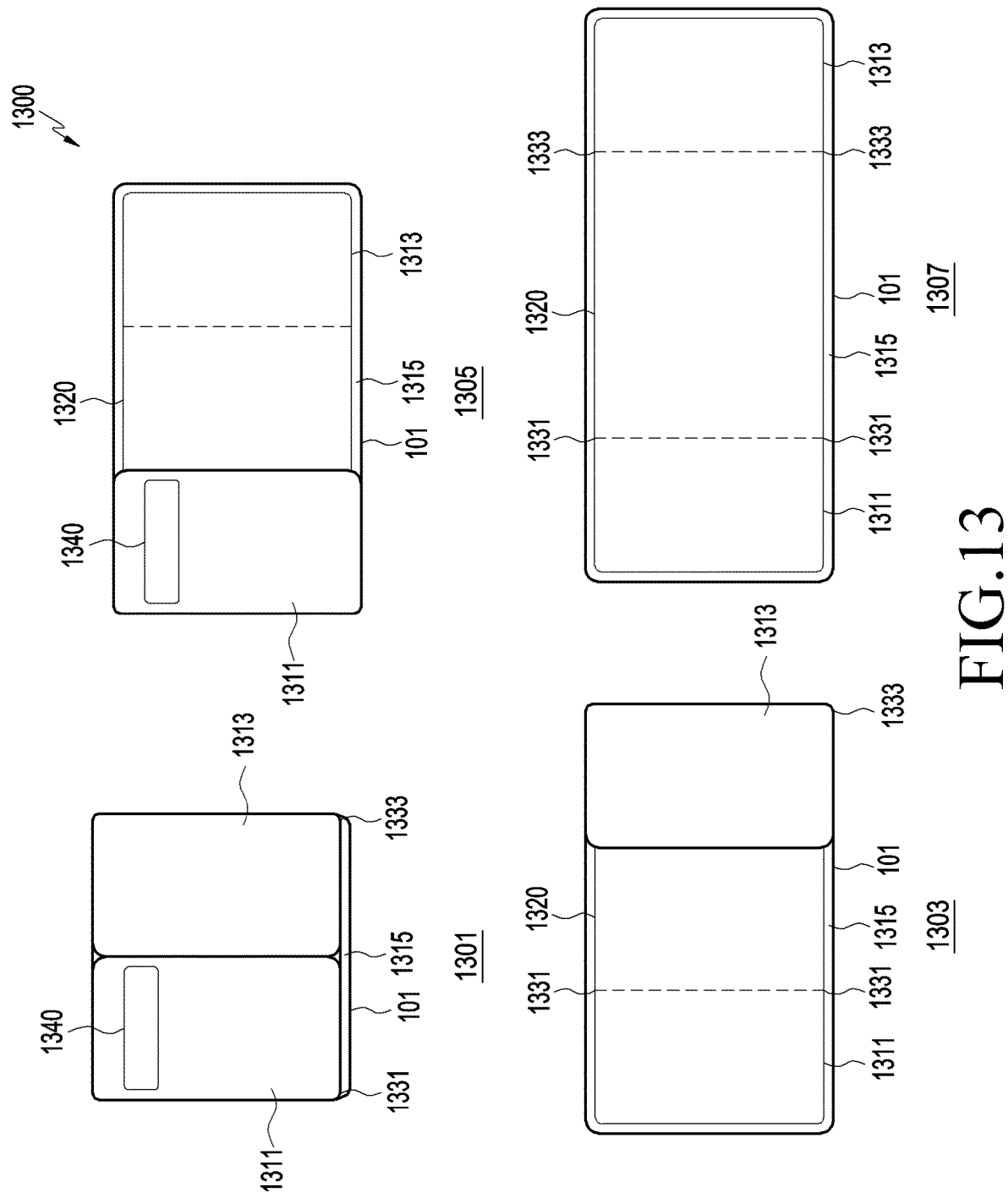
FIG. 13 is a diagram illustrating an example electronic device depending on the state of a foldable display that is folded or unfolded in the horizontal direction of the electronic device according to various embodiments.

FIG. 13 is a diagram 1300 illustrating an example electronic device 101 in various states folded or unfolded in the horizontal direction of the electronic device 101 according to various embodiments.

Comparing FIG. 2 with FIG. 13, FIG. 2 may show an electronic device 101 including a foldable display that is folded or unfolded in the vertical direction of the electronic device 101, and FIG. 13 may show an electronic device 101 including a foldable display that is folded or unfolded in the horizontal direction of the electronic device 101.

Referring to FIG. 13 (diagrams 1301, 1303, 1305 and 1307), in an embodiment, the electronic device 101 may include a first housing 1311, a second housing 1313, a third housing 1315, a first hinge 1331, and a second hinge 1333, a first display 1320, and a second display 1340.

In an embodiment, the embodiments in which at least one of the first housing 1311 or the second housing 1313 pivots around a pivotal axis arranged in the vertical direction (e.g., the axial direction of the first hinge portion 1331 and the second hinge portion 1333) relative to the third housing 1315 in diagrams 1301, 1303, 1305 and 1307 in FIG. 13 are the same as or similar to the embodiments in which at least one of the first housing 211 or the second housing 213 pivots around the pivotal axis arranged in the horizontal direction relative to the third housing 215, which have been described with reference to FIGS. 2, 3, 4, 5, 6, 7, 8, 9, 10, 11 and 12. Thus, a detailed description thereof may not be repeated here.

Figure 14:
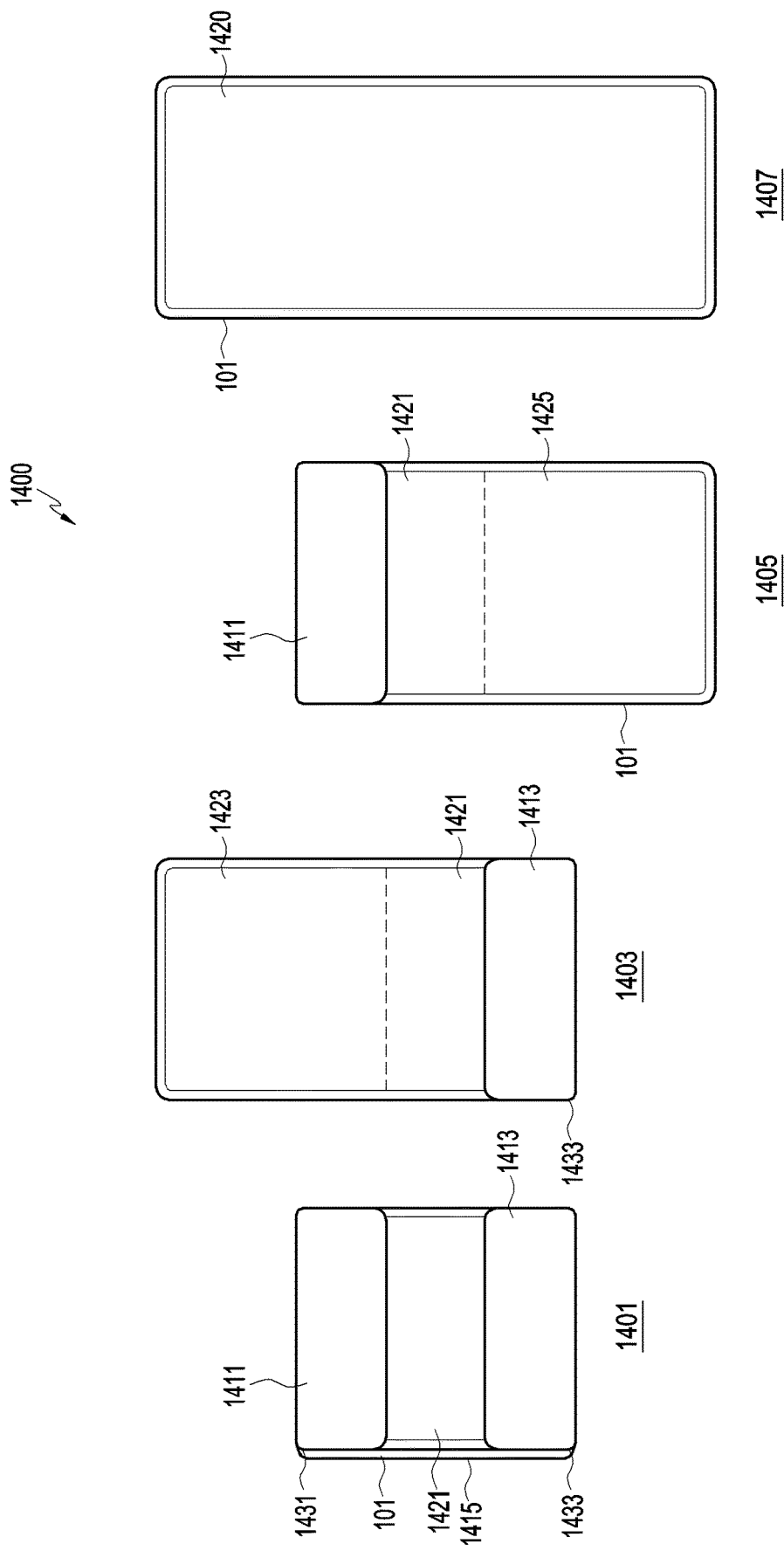
FIG. 14 is a diagram illustrating various states of an example electronic device according to various embodiments.

FIG. 14 is a diagram 1400 illustrating an example electronic device 101 in various states according to various embodiments.

Referring to FIG. 14, in an embodiment, the electronic device 101 may include a first housing 1411, a second housing 1413, a third housing 1415, a first hinge 1431, and a second hinge 1433, and a first display 1420.

In an embodiment, the first housing 1411, the second housing 1413, and the third housing 1415 may be connected to each other. One side of the first housing 1411 may be connected to one side of the third housing 1415, and one side of the second housing 1413 may be connected to the other side of the third housing 1415. In an embodiment, the first housing 1411 and the third housing 1415 may be connected by the first hinge portion 1431 such that the first housing 1411 and the third housing 1415 pivot around (or based on) the first hinge portion 1431. In an embodiment, the second housing 1413 and the third housing 1415 may be connected by the second hinge portion 1433 such that the second housing 1413 and the third housing 1415 pivot around the second hinge portion 1433.

In an embodiment, the first display 1420 (see 1407) may be viewable from the outside through a first area of the first housing 1411, a second area of the second housing 1413, and a third area of the third housing 1415. For example, the first display 1420 may be arranged on the first housing 1411, the second housing 1413, and the third housing 1415 across the first hinge portion 1431 and the second hinge portion 1433.

In an embodiment, the first display 1420 may be a foldable display. In an embodiment, the first display 1420 may be folded or unfolded according to an operation in which at least one of the first housing 1411 or the second housing 1413 pivots around at least one of the first hinge portion 1431 or the second hinge portion 1433 relative to the third housing 1415. Although examples in which the first display 1420 is folded or unfolded will be described below, the disclosure is not limited thereto. For example, the first display 1420 may be implemented to be bendable, and the examples of the foldable first display 1420 may be applied to the examples of the bendable first display 1420 in the same manner or in a similar manner.

In an embodiment, diagram 1401 may represent the state in which the electronic device 101 is fully folded (hereinafter, referred to as a "first state"). In an embodiment, in the first state, the first area of the first housing 1411 and the second area of the second housing 1413 may face in the same direction, and the third area of the third housing 1415 may face in the direction opposite the direction in which the first area of the first housing 1411 and the second area of the second housing 1413 face. In the first state, the third area of the third housing 1415 may face the first area of the first housing 1411 and the second area of the second housing 1413. In the first state, a first part 1421 of the first display 1420 (hereinafter, referred to as a "first part of the first display 1420") may be viewable to the outside, and the remaining portions of the first display 1420, excluding the first part 1421 of the first display 1420, may not be viewable to the outside.

In an embodiment, diagram 1403 may represent the state in which the first housing 1411 is unfolded and the second housing 1413 is folded relative to the third housing 1415 (hereinafter, referred to as a "second state"). In an embodiment, in the second state, the first area of the first housing 1411 and the third area of the third housing 1415 may face in the same direction, and the second area of the second housing 1413 may face in the direction opposite the direction in which the third area of the third housing 1415 faces. In the second state, a portion of the first display 1420 may be viewable to the outside, and the remaining portions of the first display 1420 may not be viewable to the outside. For example, in the second state, a portion of the first display 1420, which corresponds to the first area of the first housing 1411 (or which is disposed in the first area of the first housing 1411), a portion 1423 of the first display 1420, among the third area of the third housing 1415, which is closed (or covered) by the first housing 1411 in the first state (hereinafter, referred to as a "second part of the first display 1420"), and a first part 1421 of the first display 1420 may be viewable to the outside.

In an embodiment, diagram 1405 may represent the state in which the first housing 1411 is folded and the second housing 1413 is unfolded relative to the third housing 1415 (hereinafter, referred to as a "third state"). In an embodiment, in the third state, the first area of the first housing 1411 face in the direction opposite the direction in which the third area of the third housing 1415 faces, and the second area of the second housing 1413 and the third area of the third housing 1415 may face in the same direction. In the third state, a portion of the first display 1420 may be viewable to the outside, and the remaining portions of the first display 1420 may not be viewable to the outside. For example, in the third state, a portion of the first display 1420, which corresponds to the second area of the second housing 1413 (or which is disposed in the second area of the second housing 1413) and a portion 1425 of the first display 1420, among the third area of the third housing 1415, which is closed by the second housing 1413 in the first state (hereinafter, referred to as a "third part of the first display 1420") may be viewable to the outside. In the third state, the second part 1423 of the first display 1420 may not be viewable to the outside.

In an embodiment, diagram 1407 may represent the state in which the electronic device 101 is fully unfolded, for example, the first housing 1411 and the second housing 1413 are unfolded relative to the third housing 1415 (hereinafter, referred to as a "fourth state"). In an embodiment, in the fourth state, the first area of the first housing 1411, the second area of the second housing 1413, and the third area of the third housing 1415 may face in the same direction. In the fourth state, the first display 1420 (e.g., the entire front surface of the first display 1420) may be viewable to the outside. For example, in the fourth state, all of the first part 1421 to the third part 1425 of the first display 1420 may be viewable to the outside.

Although not shown in FIG. 14, in an embodiment, the electronic device 101 may include at least one sensor for detecting the first state, the second state, the third state, and the fourth state. In an embodiment, the at least one sensor may include at least one of a hall sensor, a proximity sensor, an angle sensor, a load cell, an infrared sensor, a pressure sensor, an acceleration sensor, a gyro sensor, or an electromagnetic sensor. However, at least one sensor for detecting the first state, the second state, the third state, and the fourth state of the electronic device 101 is not limited to the above-described examples.

Although not shown in the drawings, a method of providing a screen through the electronic device 101 including a foldable display illustrated in FIG. 14 may be, at least in part, the same as or similar to the method described with reference to FIGS. 2 to 13. For example, information (or a screen) displayed through the first part 1421 of the first display 1420, information displayed through the second part 1423 of the first display 1420, information displayed through the third part 1425 of the first display 1420, and information displayed through the entire area of first display 1420 in FIG. 14 may be substantially the same as the information (or the screen) displayed through the second display 240, the information displayed through the first part 221 and 225-1 of the first display 220, the information displayed through the second part 223 and 225-2 of the first display 220, and the information displayed through the entire area of the first display 220 in FIGS. 2 to 13, respectively. Accordingly, a detailed description of a method of providing a screen through the electronic device 101 including a foldable display illustrated in FIG. 14 may not be repeated here.

Figure 15:
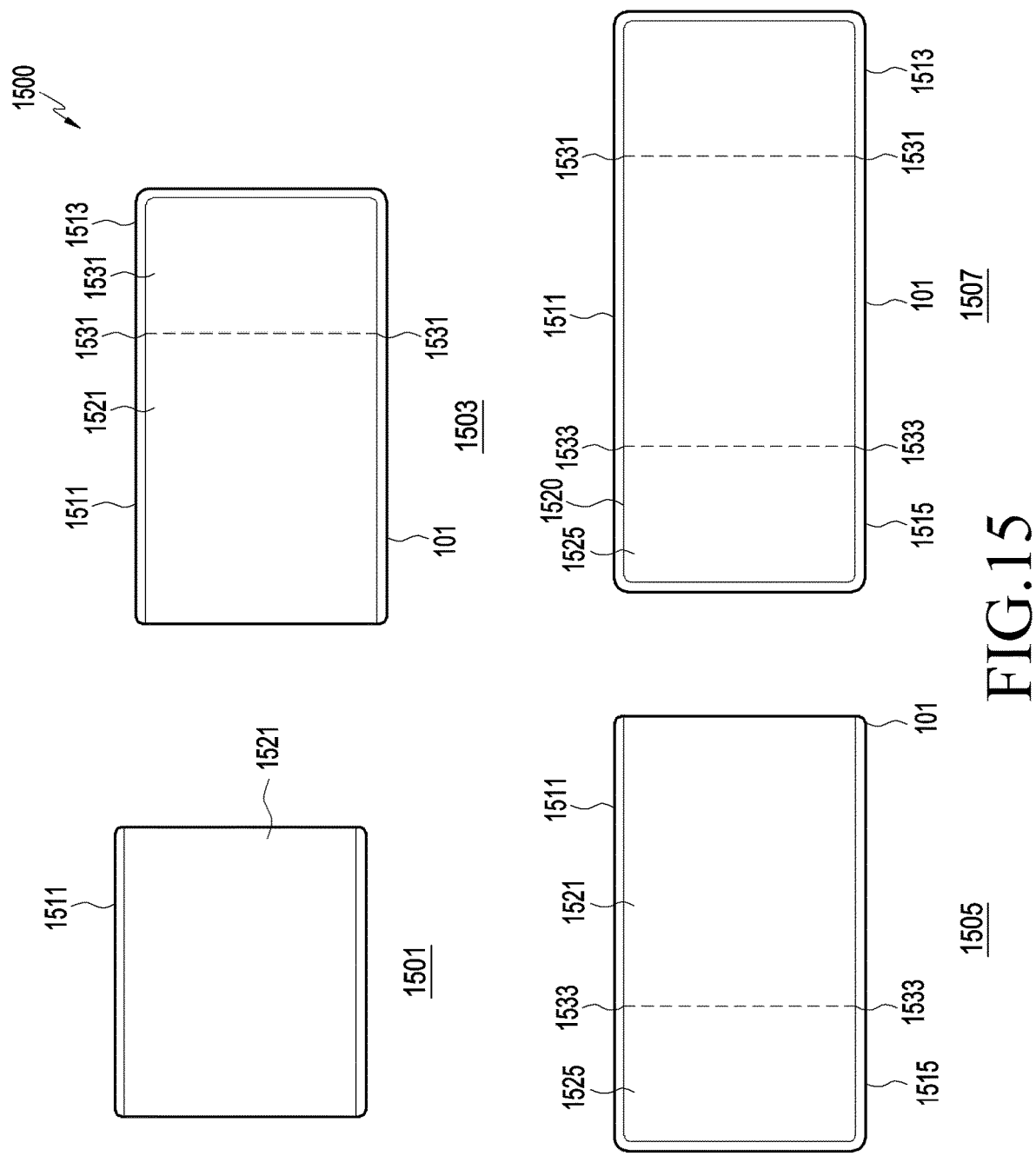
FIG. 15 is a diagram illustrating an example method of providing a screen depending on the state of an electronic device including an out-folding type foldable display according to various embodiments.

FIG. 15 is a diagram 1500 illustrating and method of providing a screen in various states of an electronic device 101 including an out-folding type foldable display according to various embodiments.

Referring to FIG. 15, in an embodiment, diagrams 1501, 1503 and 1507 may show an electronic device 101 implemented in an out-folding manner in which a first part 1511 of a first display 1520 (see 1507) disposed in a first area of a first housing 1511 faces in the direction opposite the direction in which a second part 1513 of the first display 1520 disposed in a second area of a second housing 1513 and a third part 1515 of the first display 1520 disposed in a third area of the third housing 1515 face in the state in which the electronic device 101 is fully folded.

In an embodiment, the electronic device 101 may include a first housing 1511, a second housing 1513, a third housing 1515, a first hinge portion 1531, a second hinge portion 1533, and a first display 1520.

In an embodiment, the first housing 1511, the second housing 1513, and the third housing 1515 may be connected to each other. One side of the first housing 1511 may be connected to one side of the second housing 1513, and the other side of the first housing 1511 may be connected to one side of the third housing 1515. In an embodiment, the first housing 1511 and the second housing 1513 may be connected by the first hinge portion 1531 such that the first housing 1511 and the second housing 1513 pivot (or rotate) around (or based on) the first hinge portion 1531. In an embodiment, the first housing 1511 and the third housing 1515 are connected by the second hinge portion 1533 such that the first housing 1511 and the third housing 1515 pivot around the second hinge portion 1533.

In an embodiment, the first display 1520 may be viewable to the outside through a first area of the first housing 1511, a second area of the second housing 1513, and a third area of the third housing 1515. For example, the first display 1520 may be arranged on the first housing 1511, the second housing 1513, and the third housing 1515 across the first hinge portion 1531 and the second hinge portion 1533.

In an embodiment, the first display 1520 may be a foldable display. In an embodiment, the first display 1520 may be folded or unfolded by an operation in which at least one of the second housing 1513 or the third housing 1515 pivots around at least one of the first hinge portion 1531 or the second hinge portion 1533 relative to the first housing 1511.

In an embodiment, diagram 1501 may represent the state in which the electronic device 101 is fully folded (hereinafter, referred to as a "first state"). In an embodiment, in the first state, the first area of the first housing 1511 may face in the direction opposite the direction in which the second area of the second housing 1513 and the third area of the third housing 1515 face.

In an embodiment, the processor 120 may display a first screen related to an event through the first part 1511 of the first display 1520 in the first state. Since various embodiments of displaying the first screen in the first state are, at least in part, the same as or similar to the embodiments described through operation 401 in FIG. 4, a detailed description thereof may not be repeated here.

In an embodiment, diagram 1503 may represent the state in which the second housing 1513 is unfolded and the third housing 1515 is folded relative to the first housing 1511 (hereinafter, referred to as a "second state"). In an embodiment, in the second state, the first area of the first housing 1511 and the second area of the second housing 1513 may face in the same direction, and the first area of the first housing 1511 may face in the direction opposite the direction in which the third area of the third housing 1515 faces.

In an embodiment, if it is detected that the electronic device 101 is changed from the first state to the second state through at least one sensor, the processor 120 may display a second screen of an application related to an event through the first part 1521 of the first display 1520 and the second part 1523 of the first display 1520. Since various embodiments of displaying the second screen in the second state are, at least in part, the same as or similar to the embodiments described through operation 403 in FIG. 4, a detailed description thereof may not be repeated here.

In an embodiment, diagram 1505 may represent the state in which the second housing 1513 is folded and the third housing 1515 is unfolded relative to the first housing 1511 (hereinafter, referred to as a "third state"). In an embodiment, in the third state, the first area of the first housing 1511 and the third area of the third housing 1515 may face in the same direction, and the first area of the first housing 1511 may face in the direction opposite the direction in which the second area of the second housing 1513 faces.

In an embodiment, if it is detected that the electronic device 101 is changed from the first state to the third state through at least one sensor, the processor 120 may display a third screen of an application related to an event, which is different, at least in part, from the second screen displayed in the second state, through the first part 1521 of the first display 1520 and the third part 1525 of the first display 1520. Since various embodiments of displaying the third screen in the third state are, at least in part, the same as or similar to the embodiments described through operation 405 in FIG. 4, a detailed description thereof may not be repeated here.

In an embodiment, diagram 1507 may represent the state in which the electronic device 101 is fully unfolded, for example, the second housing 1513 and the third housing 1515 are unfolded relative to the first housing 1511 (hereinafter, referred to as a "fourth state"). In an embodiment, in the fourth state, the first area of the first housing 1511, the second area of the second housing 1513, and the third area of the third housing 1515 may face in the same direction.

In an embodiment, if it is detected that the electronic device 101 is changed from the first state to the fourth state through at least one sensor, the processor 120 may display a fourth screen of an application related to an event, which is different, at least in part, from at least one of the second screen displayed in the second state or the third screen displayed in the third state, through the first display 1520 (e.g., the first part 1521 of the first display 1520, the second part 1523 of the first display 1520, and the third part 1525 of the first display 1520). Since various embodiments of displaying the fourth screen in the fourth state are, at least in part, the same as or similar to the embodiments described through operation 507 in FIG. 5, a detailed description thereof may not be repeated here.

Figure 16:
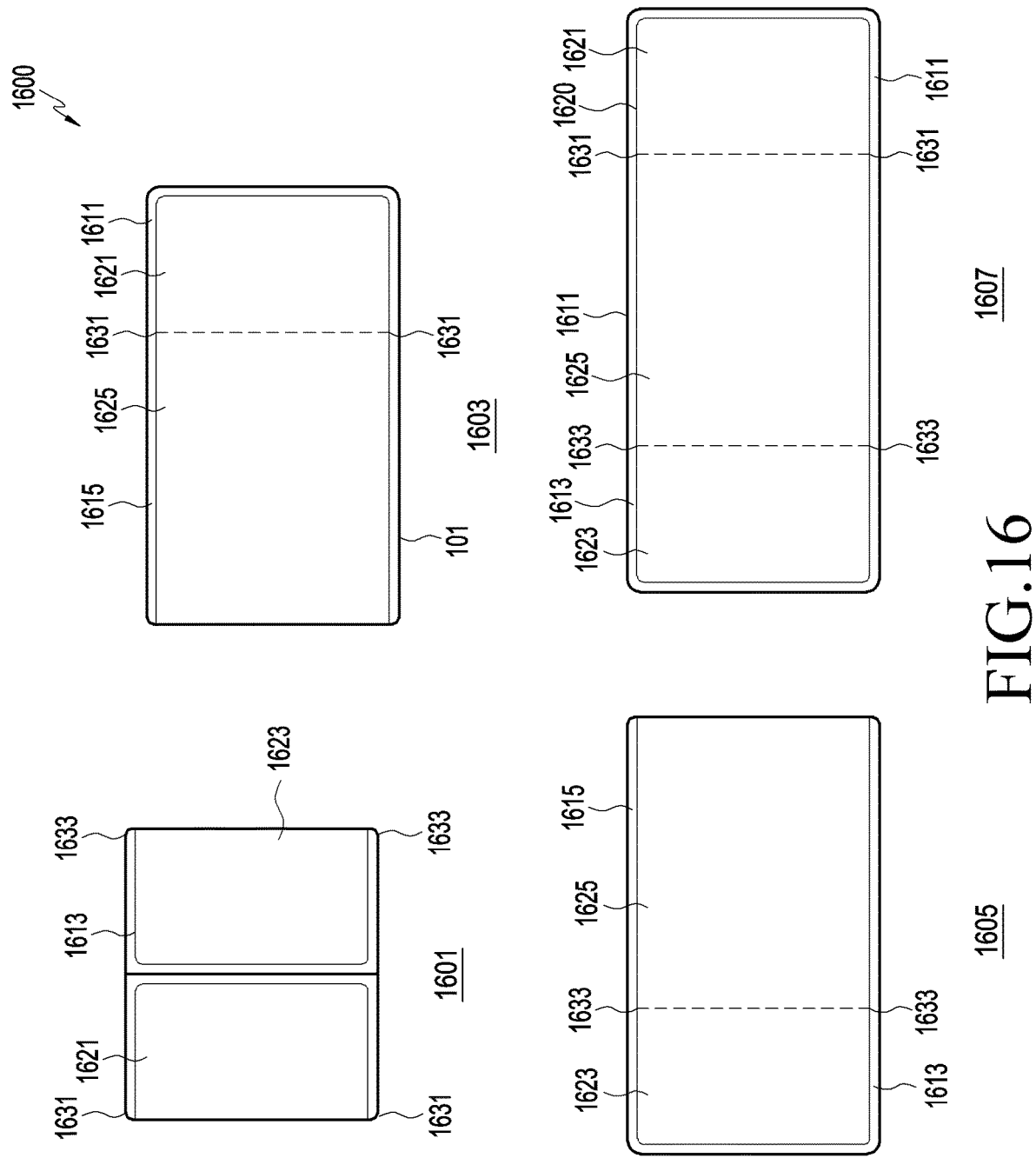
FIG. 16 is a diagram illustrating an example method of providing a screen depending on the state of an electronic device including an out-folding type foldable display according to various embodiments.

FIG. 16 is a diagram 1600 illustrating an example method of providing a screen in various states of an electronic device 101 including an out-folding type foldable display according to various embodiments.

Referring to FIG. 16, in an embodiment, diagrams 1601, 1603, 1605 and 1607 may show an electronic device 101 implemented in an out-folding manner in which a third part 1625 of a first display 1620 disposed in a third area of a third housing 1615 faces in the direction opposite the direction in which a first part 1621 of the first display 1620 disposed in a first area of a first housing 1611 and a second part 1623 of the first display 1620 disposed in a second area of a second housing 1613 face in the state in which the electronic device 101 is fully folded.

In an embodiment, the electronic device 101 may include a first housing 1611, a second housing 1613, a third housing 1615, a first hinge portion 1631, a second hinge portion 1633, and a first display 1620.

In an embodiment, the first housing 1611, the second housing 1613, and the third housing 1615 may be connected to each other. One side of the first housing 1611 may be connected to one side of the third housing 1615, and one side of the second housing 1613 may be connected to the other side of the third housing 1615. In an embodiment, the first housing 1611 and the third housing 1615 may be connected by the first hinge portion 1631 such that the first housing 1611 and the third housing 1616 pivot around (or based on) the first hinge portion 1631. In an embodiment, the second housing 1613 and the third housing 1615 are connected by the second hinge portion 1633 such that the second housing 1613 and the third housing 1615 pivot around the second hinge portion 1633.

In an embodiment, the first display 1620 may be viewable to the outside through a first area of the first housing 1611, a second area of the second housing 1613, and a third area of the third housing 1615. For example, the first display 1620 may be arranged on the first housing 1611, the second housing 1613, and the third housing 1615 across the first hinge portion 1631 and the second hinge portion 1633.

In an embodiment, the first display 1620 may be a foldable display. In an embodiment, the first display 1620 may be folded or unfolded by an operation in which at least one of the first housing 1611 or the second housing 1613 pivots around at least one of the first hinge portion 1631 or the second hinge portion 1633 relative to the third housing 1615.

In an embodiment, diagram 1601 may represent the state in which the electronic device 101 is fully folded (hereinafter, referred to as a "first state").

In an embodiment, in the first state, the first area of the first housing 1611 may face in the same direction as the direction in which the second area of the second housing 1613 faces, and may face in the direction opposite the direction in which the third area of the third housing 1615 faces.

In an embodiment, the processor 120 may display a first screen related to an event through the first part 1621 of the first display 1620 in the first state. Since various embodiments of displaying the first screen in the first state are, at least in part, the same as or similar to the embodiments described through operation 401 in FIG. 4, a detailed description thereof may not be repeated here.

In an embodiment, diagram 1603 may represent the state in which the first housing 1611 is unfolded and the second housing 1613 is folded relative to the third housing 1615 (hereinafter, referred to as a "second state"). In an embodiment, in the second state, the first area of the first housing 1611 and the third area of the third housing 1615 may face in the same direction, which is opposite to the direction in which the second area of the second housing 1613 faces.

In an embodiment, if it is detected that the electronic device 101 is changed from the first state to the second state through at least one sensor, the processor 120 may display a $2$-$1^{st}$ screen of an application related to an event through the first part 1621 of the first display 1620 and the third part 1625 of the first display 1620.

In an embodiment, diagram 1605 may represent the state in which the first housing 1611 is folded and the second housing 1613 is unfolded relative to the third housing 1615 (hereinafter, referred to as a "third state"). In an embodiment, in the third state, the second area of the second housing 1613 and the third area of the third housing 1615 may face in the same direction, which may be opposite to the direction in which the first area of the first housing 1611 faces.

In an embodiment, if it is detected that the electronic device 101 is changed from the first state to the third state through at least one sensor, the processor 120 may display a $2$-$2^{nd}$ screen of an application related to an event, which is different, at least in part, from the second screen displayed in the second state, through the second part 1623 of the first display 1620 and the third part 1625 of the first display 1620.

In an embodiment, diagram 1607 may represent the state in which the electronic device 101 is fully unfolded, for example, the first housing 1611 and the second housing 1613 are unfolded relative to the third housing 1615 (hereinafter, referred to as a "fourth state"). In an embodiment, in the fourth state, the first area of the first housing 1611, the second area of the second housing 1613, and the third area of the third housing 1615 may face in the same direction.

In an embodiment, if it is detected that the electronic device 101 is changed from the first state to the fourth state through at least one sensor, the processor 120 may display, through the first display 1620, a $2$-$3^{rd}$ screen of an application related to an event, which is different, at least in part, from at least one of the $2$-$1^{st}$ screen displayed in the second state or the $2$-$2^{nd}$ screen displayed in the third state.

According to various example embodiments, a method of providing a screen using a foldable display in an electronic device may include: displaying a first screen of an application in a first state in which a first area of a first housing of the electronic device and a second area of the electronic device face a third area of the electronic device; detecting, through at least one sensor a change from the first state to a second state in which the first area and the third area face in a same direction or a third state in which the second area and the third area face in a same direction; determining a second screen of the application to be displayed through a first display in a state, among the second state and the third state, changed from the first state; and displaying the second screen through the first display in the changed state.

In various example embodiments, the determining of the second screen of the application may include: obtaining information for configuring a screen corresponding to the changed state from a memory including information for configuring screens for the application corresponding to the second state and the third state, respectively, to be displayed based on the electronic device being changed from the first state to the second state or the third state; and determining the second screen to be displayed through the first display in the changed state based on the obtained information.

In various example embodiments, the determining of the second screen of the application may include determining the second screen to be displayed through the first display in the changed state based on at least one of an identity of the application or a state of the application in the first state.

In various example embodiments, the determining of the second screen of the application may include: based on the electronic device being changed from the first state to the second state, determining a first second screen of the application to be displayed through the first display in the second state; and based on the electronic device being changed from the first state to the third state, determining a 2-second screen of the application to be displayed through the first display in the third state, which is different, at least in part, from the first second screen.

In various example embodiments, the displaying of the first screen of the application in the first state may include displaying the first screen of the application in the first state through a second display viewable through a fourth area of the first housing, which faces in the direction opposite the direction in which the first area of the first housing faces.

In various example embodiments, the determining of the second screen of the application may include determining the first second screen or the second second screen to be different based on whether the application is running in the foreground through the first display.

In various example embodiments, the determining of the second screen of the application may include determining to display a screen associated with the second screen through the second display based on the changed state being the third state.

In various embodiments, the first second screen may include details of information included in the first screen, and the second screen may include a user interface configured to receive an input to control functions of the application.

In various example embodiments, the method may further include detecting, through at least one sensor, that the electronic device is changed from the first state to a fourth state in which the first area, the second area, and the third area face a same direction based on an operation in which the second area is unfolded to face in a same direction as the third area within a specified time after the first area is unfolded to face in a same direction as the third area in the first state, or based on an operation in which the first area is unfolded to face in a same direction as the third area within a specified time after the second area is unfolded to face in a same direction as the third area in the first state.

In various example embodiments, the application may include a chat message application, an email application, a call application, a music application, a video application, a real-time broadcast application, and a weather application.

In addition, the structure of data used in the embodiments described above may be recorded in a computer-readable recording medium through various means. The computer-readable recording medium includes a storage medium such as a magnetic storage medium (e.g., ROM, floppy disks, hard disks, etc.) and an optical reading medium (e.g., CD-ROM, DVDs, etc.).

While the disclosure has been illustrated and described with reference to various example embodiments, it will be understood that the various example embodiments are intended to be illustrative, not limiting. It will be further understood by one of ordinary skill in the art that various changes in form and detail may be made without departing from the true spirit and full scope of the disclosure, including the appended claims and their equivalents.

What is claimed is:

1. An electronic device comprising:
   a housing comprising a first housing, a second housing, and a third housing;
   a first hinge configured to enable the first housing and the third housing to pivot, and a second hinge configured to enable the second housing and the third housing to pivot;
   a first display viewable through a first area of the first housing, a second area of the second housing, and a third area of the third housing;
   at least one sensor;
   a processor operably connected to the first display and the at least one sensor; and
   a memory operably connected to the processor,
   wherein the memory stores instructions that are configured to, when executed, cause the processor to control the electronic device to:
   display a first screen of an application in a first state in which the first area and the second area face the third area;
   detect, through the at least one sensor, a change from the first state to a second state in which the first area and the third area face a same direction or a third state in which the second area and the third area face a same direction;
   determine a second screen of the application to be displayed through the first display in a state, among the second state and the third state, changed from the first state;
   control to display the second screen through the first display in the changed state;
   based on the electronic device being changed from the first state to the second state, determine a third screen of the application to be displayed through the first display in the second state; and
   based on the electronic device being changed from the first state to the third state, determine a fourth screen of the application to be displayed through the first display in the third state, the fourth screen being different, at least in part, from the third second screen.

2. The electronic device of claim 1, wherein the memory stores information for configuring screens for the application corresponding to the second state and the third state, respectively, to be displayed based on the electronic device being changed from the first state to the second state or the third state, and
   wherein the instructions, when executed, cause the processor to control the electronic device to:
   obtain information for configuring a screen corresponding to the changed state from the memory; and
   determine the second screen to be displayed through the first display in the changed state based on the obtained information.

3. The electronic device of claim 1, wherein the instructions are configured to, when executed, cause the processor to control the electronic device to: determine the second screen to be displayed through the first display in the changed state based on at least one of an identity of the application or a state of the application in the first state.

4. The electronic device of claim 1, wherein the instructions are configured to, when executed, cause the processor to control the electronic device to: determine the third screen or the fourth screen to be different based on whether the application is running in the foreground through the first display.

5. The electronic device of claim 1, wherein the instructions are configured to, when executed, cause the processor to control the electronic device to: control to display the first screen of the application in the first state through a second display viewable through a fourth area of the first housing, the fourth area facing a direction opposite a direction which the first area of the first housing faces.

6. The electronic device of claim 5, wherein the instructions are configured to, when executed, cause the processor to control the electronic device to: determine to display a screen associated with the fourth screen through the second display based on the changed state being the third state.

7. The electronic device of claim 1, wherein the third screen comprises details of information included in the first screen, and
   wherein the fourth screen comprises a user interface configured receive and input to control functions of the application.

8. The electronic device of claim 1, wherein the instructions are configured to, when executed, cause the processor to control the electronic device to: detect, through at least one sensor, a change from the first state to a fourth state in which the first area, the second area, and the third area face a same direction based on an operation in which the second area is unfolded to face a same direction as the third area within a specified time after the first area is unfolded to face a same direction as the third area in the first state, or based on an operation in which the first area is unfolded to face a same direction as the third area within a specified time after the second area is unfolded a to face a same direction as the third area in the first state.

9. The electronic device of claim 1, wherein the application comprises a chat message application, an email application, a call application, a music application, a video application, a real-time broadcast application, and/or a weather application.

10. A method of providing a screen using a foldable display in an electronic device, the method comprising:
- displaying a first screen of an application in a first state in which a first area of a first housing of the electronic device and a second area of the electronic device face a third area of the electronic device;
- detecting, through at least one sensor, a change from the first state to a second state in which the first area and the third area face a same direction or a third state in which the second area and the third area face a same direction;
- determining a second screen of the application to be displayed through a first display in a state, among the second state and the third state, changed from the first state; and
- displaying the second screen through the first display in the changed state,
- wherein the determining the second screen of the application comprises:
  - based on the electronic device being changed from the first state to the second state, determining a third screen of the application to be displayed through the first display in the second state; and
  - based on the electronic device being changed from the first state to the third state, determining a fourth screen of the application to be displayed through the first display in the third state, the fourth screen being different, at least in part, from the third screen.

11. The method of claim 10,
wherein the determining the second screen of the application comprises:
- obtaining information for configuring a screen corresponding to the changed state from a memory storing information for configuring screens for the application corresponding to the second state and the third state, respectively, to be displayed based on the electronic device being changed from the first state to the second state or the third state; and
- determining the second screen to be displayed through the first display in the changed state based on the obtained information.

12. The method of claim 10, wherein the determining of the second screen of the application comprises: determining the second screen to be displayed through the first display in the changed state based on at least one of an identity of the application or a state of the application in the first state.

13. The method of claim 10, wherein the determining second screen of the application comprises: determining the third screen or the fourth screen to be different based on whether the application is running in the foreground through the first display.

14. The method of claim 10, wherein the displaying the first screen of the application in the first state comprises: displaying the first screen of the application in the first state through a second display viewable through a fourth area of the first housing, the fourth area facing a direction opposite a direction which the first area of the first housing faces.

15. The method of claim 14, wherein the determining the second screen of the application comprises: determining to display a screen associated with the fourth screen through the second display based on the changed state being the third state.

16. The method of claim 10, wherein the third screen comprises details of information included in the first screen, and
wherein the fourth screen comprises a user interface configured to receive an input to control functions of the application.

17. The method of claim 10, further comprising: detecting, through at least one sensor, a change from the first state to a fourth state in which the first area, the second area, and the third area face a same direction based on an operation in which the second area is unfolded to face a same direction as the third area within a specified time after the first area is unfolded to face a same direction as the third area in the first state, or based on an operation in which the first area is unfolded to face a same direction as the third area within a specified time after the second area is unfolded to face a same direction as the third area in the first state.

18. The method of claim 10, wherein the application comprises a chat message application, an email application, a call application, a music application, a video application, a real-time broadcast application, and/or a weather application.

* * * * *